US 12,147,167 B2

(12) United States Patent
Kanehara et al.

(10) Patent No.: US 12,147,167 B2
(45) Date of Patent: Nov. 19, 2024

(54) IMPRINT APPARATUS WITH MOVABLE STAGES

(71) Applicant: ASML Netherlands B.V., Veldhoven (NL)

(72) Inventors: Junichi Kanehara, Eindhoven (NL); Hans Butler, Best (NL); Paul Corné Henri De Wit, Eindhoven (NL); Engelbertus Antonius Fransiscus Van Der Pasch, Oirschot (NL)

(73) Assignee: ASML Netherlands B.V., Veldhoven (NL)

( * ) Notice: Subject to any disclaimer, the term of this patent is extended or adjusted under 35 U.S.C. 154(b) by 0 days.

(21) Appl. No.: 15/775,602

(22) PCT Filed: Sep. 30, 2016

(86) PCT No.: PCT/EP2016/073380
§ 371 (c)(1),
(2) Date: May 11, 2018

(87) PCT Pub. No.: WO2017/084797
PCT Pub. Date: May 26, 2017

(65) Prior Publication Data
US 2018/0329292 A1    Nov. 15, 2018

(30) Foreign Application Priority Data

Nov. 20, 2015  (EP) ..................................... 15195532
Feb. 24, 2016  (EP) ..................................... 16157155

(51) Int. Cl.
*G03F 9/00* (2006.01)
*G03F 7/00* (2006.01)

(52) U.S. Cl.
CPC ........ *G03F 9/7042* (2013.01); *G03F 7/70341* (2013.01); *G03F 7/70733* (2013.01); *G03F 7/70925* (2013.01); *G03F 7/70* (2013.01)

(58) Field of Classification Search
CPC .............................................. G03F 2007/2067
See application file for complete search history.

(56) References Cited

U.S. PATENT DOCUMENTS 4,509,852 A    4/1985  Tabarelli et al.
7,541,603 B2 *  6/2009  Van Herpen ........ G03F 7/70558
                                                        378/34

(Continued)

FOREIGN PATENT DOCUMENTS

EP    1 420 298 A2    5/2004
EP    1420298 A3     10/2005

(Continued)

OTHER PUBLICATIONS

English-language abstract of Japanese Patent Application Publication No. 2006-190866 A, published on Jul. 20, 2006; 1 page.

(Continued)

*Primary Examiner* — Emmanuel S Luk
*Assistant Examiner* — Nicholas J Chidiac
(74) *Attorney, Agent, or Firm* — Sterne, Kessler, Goldstein & Fox P.L.L.C.

(57) ABSTRACT

A method of operating a lithographic apparatus that comprises: a projection system configured to provide exposure radiation for patterning a substrate underneath the projection system; a first stage configured to support a first substrate; a second stage configured to support a second substrate; and a third stage accommodating a component that includes at least one of a sensor and a cleaning device; wherein the method comprises starting a pre-exposure scrum sweep operation after starting a substrate exchange operation;

(Continued)

wherein during the pre-exposure scrum sweep operation, the third stage moves away from underneath the projection system while the second stage moves to underneath the projection system; wherein during the substrate exchange operation, the first substrate is unloaded from the first stage.

20 Claims, 17 Drawing Sheets

(56) References Cited

U.S. PATENT DOCUMENTS

| | | | |
|---|---|---|---|
| 7,626,684 B2 | 12/2009 | Jeunink et al. | |
| 7,943,080 B2 | 5/2011 | Dijksman et al. | |
| 7,946,029 B2* | 5/2011 | Rangelow | G01Q 70/06 |
| | | | 29/760 |
| 8,015,939 B2* | 9/2011 | Dijksman | G03F 7/0002 |
| | | | 118/712 |
| 8,035,800 B2 | 10/2011 | Nishii | |
| 8,486,485 B2* | 7/2013 | Dijksman | B41J 2/1429 |
| | | | 427/9 |
| 8,514,366 B2 | 8/2013 | Nakano | |
| 8,764,431 B2 | 7/2014 | Yamashita et al. | |
| 8,792,084 B2 | 7/2014 | Shibazaki | |
| 8,992,206 B2 | 3/2015 | Wakabayashi | |
| 9,465,308 B2 | 10/2016 | Iwai et al. | |
| 9,535,321 B2 | 1/2017 | Maeda | |
| 9,864,271 B2 | 1/2018 | Simon | |
| 10,025,207 B2* | 7/2018 | Rangelow | G03F 9/7038 |
| 10,112,324 B2 | 10/2018 | Miyajima et al. | |
| 2004/0207824 A1 | 10/2004 | Lof et al. | |
| 2006/0132733 A1* | 6/2006 | Modderman | G03F 7/70341 |
| | | | 355/53 |
| 2006/0227307 A1* | 10/2006 | Tel | G03F 7/70783 |
| | | | 355/53 |
| 2006/0227308 A1 | 10/2006 | Brink et al. | |
| 2007/0134362 A1 | 6/2007 | Heidari | |
| 2007/0145643 A1* | 6/2007 | Dijksman | B82Y 10/00 |
| | | | 264/319 |
| 2007/0170617 A1 | 7/2007 | Choi et al. | |
| 2007/0216881 A1 | 9/2007 | Van Der Schoot et al. | |
| 2007/0248892 A1* | 10/2007 | Rangelow | G03F 9/7042 |
| | | | 430/30 |
| 2008/0003827 A1* | 1/2008 | Dijksman | B82Y 10/00 |
| | | | 427/256 |
| 2008/0074655 A1* | 3/2008 | Wilhelmus Van Herpen | |
| | | | G03F 7/70558 |
| | | | 356/450 |
| 2008/0094604 A1 | 4/2008 | Shibazaki | |
| 2008/0123067 A1* | 5/2008 | Yoda | G03F 7/70341 |
| | | | 355/30 |
| 2008/0137056 A1 | 6/2008 | Fujiwara et al. | |
| 2009/0153832 A1* | 6/2009 | Tatsuzaki | G03F 7/709 |
| | | | 355/72 |
| 2009/0174870 A1 | 7/2009 | De Jong et al. | |
| 2009/0201473 A1 | 8/2009 | Burry et al. | |
| 2009/0233234 A1 | 9/2009 | Shibazaki | |
| 2010/0045949 A1 | 2/2010 | Nakano et al. | |
| 2010/0097586 A1 | 4/2010 | Kuit et al. | |
| 2010/0097587 A1 | 4/2010 | Petrus De Jong et al. | |
| 2010/0193994 A1 | 8/2010 | Wuister et al. | |
| 2010/0195102 A1 | 8/2010 | Den Boef | |
| 2010/0289190 A1* | 11/2010 | Kawakami | B29C 43/021 |
| | | | 264/496 |
| 2010/0296068 A1* | 11/2010 | Shibazaki | G01D 5/266 |
| | | | 355/30 |
| 2010/0296070 A1 | 11/2010 | Shibazaki | |
| 2011/0014499 A1 | 1/2011 | Uchida et al. | |
| 2011/0076352 A1 | 3/2011 | Den Boef et al. | |
| 2011/0181188 A1 | 7/2011 | Nakashima et al. | |
| 2011/0215504 A1 | 9/2011 | Imai et al. | |
| 2011/0219635 A1* | 9/2011 | Rangelow | G01Q 60/16 |
| | | | 33/645 |
| 2012/0012611 A1* | 1/2012 | Dijksman | G03F 7/0002 |
| | | | 222/1 |
| 2012/0223631 A1 | 9/2012 | Yoshihara et al. | |
| 2013/0100980 A1 | 4/2013 | Abe et al. | |
| 2014/0132940 A1 | 5/2014 | Yoda | |
| 2014/0151733 A1 | 6/2014 | Koike et al. | |
| 2014/0218703 A1* | 8/2014 | Mizuno | G03F 7/70133 |
| | | | 355/67 |
| 2015/0309423 A1 | 10/2015 | Shibazaki | |

FOREIGN PATENT DOCUMENTS

| | | |
|---|---|---|
| EP | 1 791 164 A1 | 5/2007 |
| EP | 1 840 943 A1 | 10/2007 |
| EP | 1 896 772 A2 | 3/2008 |
| EP | 1791164 A4 | 12/2008 |
| EP | 1840943 A4 | 4/2010 |
| EP | 1791164 B1 | 6/2010 |
| EP | 1420298 B1 | 2/2013 |
| EP | 1791164 B2 | 8/2014 |
| JP | 2003-100613 A | 4/2003 |
| JP | 2006-024941 A | 1/2006 |
| JP | 2006-190866 A | 7/2006 |
| JP | 2007-182063 A | 7/2007 |
| JP | 2007-194601 A | 8/2007 |
| JP | 2007-281441 A | 10/2007 |
| JP | 2009-524249 A | 6/2009 |
| JP | 2010-267808 A | 11/2010 |
| JP | 2011-000806 A | 1/2011 |
| JP | 2011-060882 A | 3/2011 |
| JP | 2011-114309 A | 6/2011 |
| JP | 2011-155160 A | 8/2011 |
| JP | 2011-163839 A | 8/2011 |
| JP | 2011-171410 A | 9/2011 |
| JP | 2011-211157 A | 10/2011 |
| JP | 2012-079735 A | 4/2012 |
| JP | 2012-099685 A | 5/2012 |
| JP | 2012-109359 A | 6/2012 |
| JP | 2012-164992 A | 8/2012 |
| JP | 2012-174809 A | 9/2012 |
| JP | 2012-181997 A | 9/2012 |
| JP | 2012-186390 A | 9/2012 |
| JP | 2013-161992 A | 8/2013 |
| JP | 2013-165134 A | 8/2013 |
| JP | 2013-187465 A | 9/2013 |
| JP | 2013-236074 A | 11/2013 |
| JP | 2014-060385 A | 4/2014 |
| JP | 2015-023210 A | 2/2015 |
| JP | 2015-076521 A | 4/2015 |
| JP | 2015-119044 A | 6/2015 |
| JP | 2015-130384 A | 7/2015 |
| KR | 10-2012-0118639 A | 10/2012 |
| TW | 200625026 A | 7/2006 |
| TW | 201027265 A1 | 7/2010 |
| TW | 201032987 A1 | 9/2010 |
| TW | 201033751 A1 | 9/2010 |
| TW | 201141686 A1 | 12/2011 |
| WO | WO 99/49504 A1 | 9/1999 |
| WO | WO 2004/088741 A1 | 10/2004 |
| WO | WO 2004/090577 A2 | 10/2004 |
| WO | WO 2006/025408 A1 | 3/2006 |
| WO | WO 2007/084774 A2 | 7/2007 |
| WO | WO 2006/057263 A1 | 6/2008 |
| WO | WO 2008/147175 A1 | 12/2008 |
| WO | WO 2010/061459 A1 | 6/2010 |
| WO | WO 2009/110596 A1 | 7/2011 |
| WO | WO 2010/018825 A1 | 1/2012 |
| WO | WO 2012/176728 A1 | 12/2012 |
| WO | WO 2013/100203 A2 | 7/2013 |
| WO | WO 2013/100203 A3 | 4/2014 |
| WO | WO 2015/041335 A1 | 3/2015 |

OTHER PUBLICATIONS

English-language abstract of Japanese Patent Application Publication No. 2011-000806 A, published on Jan. 6, 2011; 1 page.
English-language abstract of Japanese Patent Application Publication No. 2011-114309 A, published on Jun. 9, 2011; 1 page.

(56) References Cited

OTHER PUBLICATIONS

English-language abstract of Japanese Patent Application Publication No. 2011-163839 A, published on Aug. 25, 2011; 1 page.
English-language abstract of Japanese Patent Application Publication No. 2012-099685 A, published on May 24, 2012; 1 page.
English-language abstract of Japanese Patent Application Publication No. 2012-174809 A, published on Sep. 10, 2012; 1 page.
English-language abstract of Japanese Patent Application Publication No. 2013-236074 A, published on Nov. 21, 2013; 1 page.
English-language abstract of Japanese Patent Application Publication No. 2014-060385 A, published on Apr. 3, 2014; 1 page.
English-language abstract of Japanese Patent Application Publication No. 2015-023210 A, published on Feb. 2, 2015; 1 page.
International Search Report and Written Opinion of the International Searching Authority directed to related International Patent Application No. PCT/EP2016/073380, mailed Feb. 8, 2017; 12 pages.
International Preliminary Report on Patentability directed to related International Patent Application No. PCT/EP2016/073380, issued May 22, 2018; 7 pages.

* cited by examiner

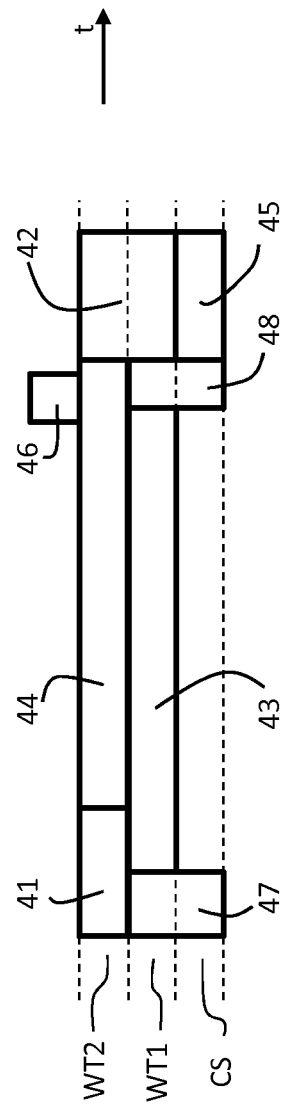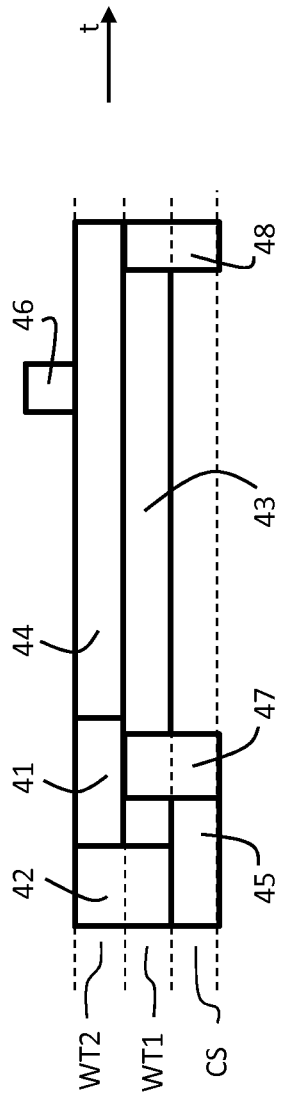

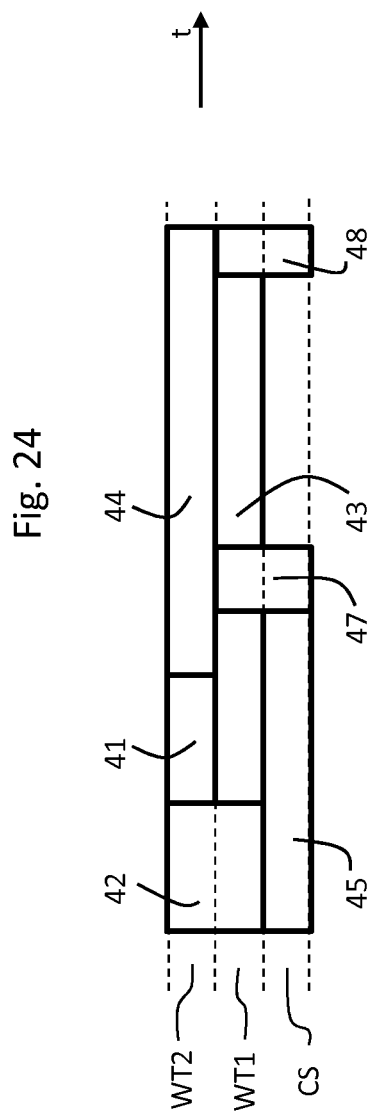

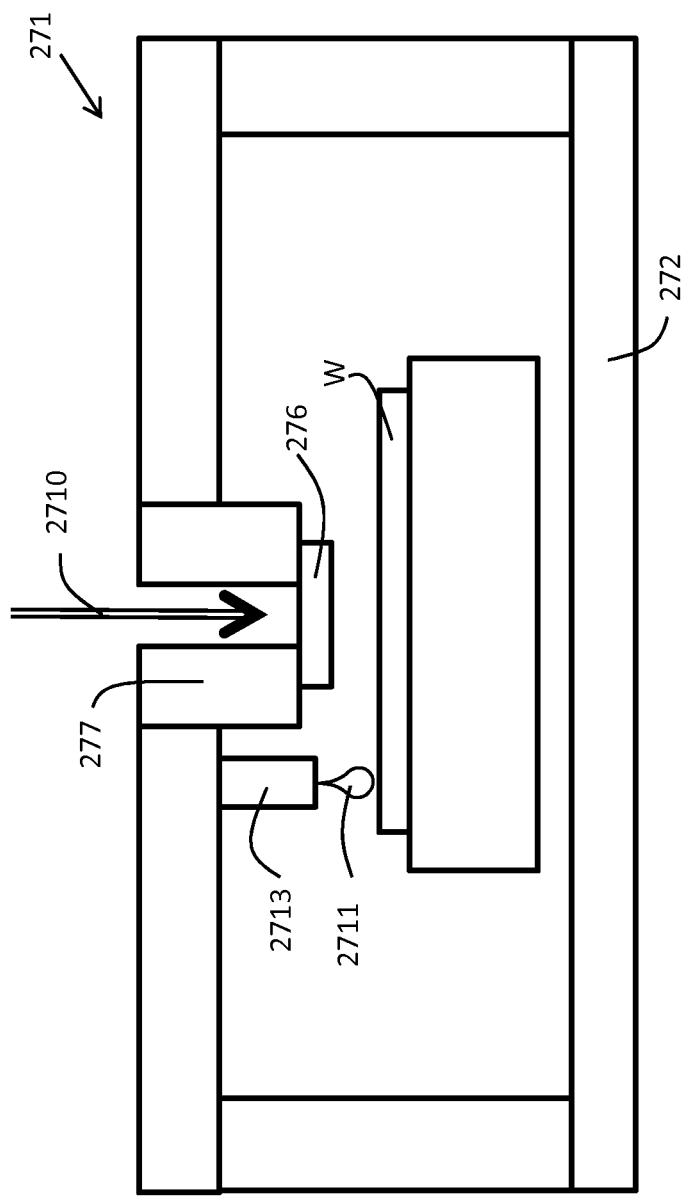

20
IMPRINT APPARATUS WITH MOVABLE STAGES

CROSS REFERENCE TO RELATED APPLICATIONS

This application claims priority of EP application 15195532.5 which was filed on 2015 Nov. 20 and EP application 16157155.9 which was filed on 2016 Feb. 24 and which are incorporated herein in their entirety by reference.

FIELD

The present invention relates to a lithographic apparatus and a method of operating a lithographic apparatus.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. comprising part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

It has been proposed to immerse the substrate in the lithographic projection apparatus in a liquid having a relatively high refractive index, e.g. water, so as to fill a space between the final element of the projection system and the substrate. In an embodiment, the liquid is distilled water, although another liquid can be used. An embodiment of the invention will be described with reference to liquid. However, another fluid may be suitable, particularly a wetting fluid, an incompressible fluid and/or a fluid with higher refractive index than air, desirably a higher refractive index than water. Fluids excluding gases are particularly desirable. The point of this is to enable imaging of smaller features since the exposure radiation will have a shorter wavelength in the liquid. (The effect of the liquid may also be regarded as increasing the effective numerical aperture (NA) of the system and also increasing the depth of focus.) Other immersion liquids have been proposed, including water with solid particles (e.g. quartz) suspended therein, or a liquid with a nano-particle suspension (e.g. particles with a maximum dimension of up to 10 nm). The suspended particles may or may not have a similar or the same refractive index as the liquid in which they are suspended. Other liquids which may be suitable include a hydrocarbon, such as an aromatic, a fluorohydrocarbon, and/or an aqueous solution.

Submersing the substrate or substrate and support table in a bath of liquid (see, for example, U.S. Pat. No. 4,509,852) means that there is a large body of liquid that must be accelerated during a scanning exposure. This requires additional or more powerful motors and turbulence in the liquid may lead to undesirable and unpredictable effects.

In an immersion apparatus, immersion fluid is handled by a fluid handling system, device structure or apparatus. In an embodiment the fluid handling system may supply immersion fluid and therefore be a fluid supply system. In an embodiment the fluid handling system may at least partly confine immersion fluid and thereby be a fluid confinement system. In an embodiment the fluid handling system may provide a barrier to immersion fluid and thereby be a barrier member, such as a fluid confinement structure. In an embodiment the fluid handling system may create or use a flow of gas, for example to help in controlling the flow and/or the position of the immersion fluid. The flow of gas may form a seal to confine the immersion fluid so the fluid handling structure may be referred to as a seal member; such a seal member may be a fluid confinement structure. In an embodiment, immersion liquid is used as the immersion fluid. In that case the fluid handling system may be a liquid handling system. In reference to the aforementioned description, reference in this paragraph to a feature defined with respect to fluid may be understood to include a feature defined with respect to liquid.

In both an immersion apparatus or in a dry apparatus, a three-stage system can be used. A lithographic apparatus that uses a three-stage system comprises three stages. For example, two of the stages may be substrate stages for carrying substrates and one of the stages may be a calibration stage where measurements can be performed. One operation performed in a lithographic apparatus that uses a three-stage system is called stage swapping, in which the positions of two of the stages are swapped. For example, the positions of two substrate stages can be swapped in a time period between exposure operations. Another operation that is performed is called substrate exchange (or wafer-exchange) in which a substrate is removed from one of the stages and/or another substrate is provided to that stage. Other operations that are performed are substrate alignment, levelling, sensing and exposure, for example.

These operations are performed in sequence when the lithographic apparatus is operated. In general, overall productivity of a lithographic apparatus is improved when throughput and/or uptime is improved. In addition, good imaging quality of a pattern transferred onto a substrate is often required for manufacturing ICs. Therefore, it is desirable, for example, to provide a lithographic apparatus and a method of operating a lithographic apparatus in which the throughput is improved and/or the imaging quality is improved and/or yield is improved and/or uptime of the lithographic apparatus is improved.

SUMMARY

According to an aspect of the invention, there is provided a method of operating a lithographic apparatus that comprises: a projection system configured to provide exposure radiation for patterning a substrate underneath the projection system; a first stage configured to support a first substrate; a second stage configured to support a second substrate; and a third stage accommodating a component that includes at least one of a sensor and a cleaning device; wherein the method comprises starting a pre-exposure scrum sweep operation after starting a substrate exchange operation; wherein during the pre-exposure scrum sweep operation, the third stage moves away from underneath the projection system while the second stage moves to underneath the projection system; wherein during the substrate exchange operation, the first substrate is unloaded from the first stage.

According to a further aspect of the invention, there is provided a lithographic apparatus comprising: a projection system configured to provide an exposure radiation for patterning a substrate; a first stage configured to support a first substrate; a second stage configured to support a second substrate; a third stage accommodating a component that includes at least one of a sensor and a cleaning device; a substrate unloader configured to unload the first substrate from the first stage during a substrate exchange operation; and a control system configured to control positioning of the first stage, the second stage, the third stage and the substrate unloader, wherein the control system is arranged to start a pre-exposure scrum sweep operation after starting the substrate exchange operation, wherein during the pre-exposure scrum sweep operation, the third stage moves away from underneath the projection system while the second stage moves to underneath the projection system.

BRIEF DESCRIPTION OF THE DRAWINGS

Embodiments of the invention will now be described, by way of example only, with reference to the accompanying schematic drawings in which corresponding reference symbols indicate corresponding parts, and in which:

FIG. 22 is a diagram showing an operational sequence of a three-stage system for a lithographic apparatus 100 not according to the invention; and FIG. 23 is a diagram showing an operational sequence of a three-stage system for a lithographic apparatus 100 according to an embodiment of the invention.

FIG. 24 is a diagram showing an operational sequence of a three-stage system for a lithographic apparatus 100 according to an alternative embodiment of the invention.

FIG. 27 schematically depicts an imprint system 271 according to an embodiment of the invention.

DETAILED DESCRIPTION

Figure 1:
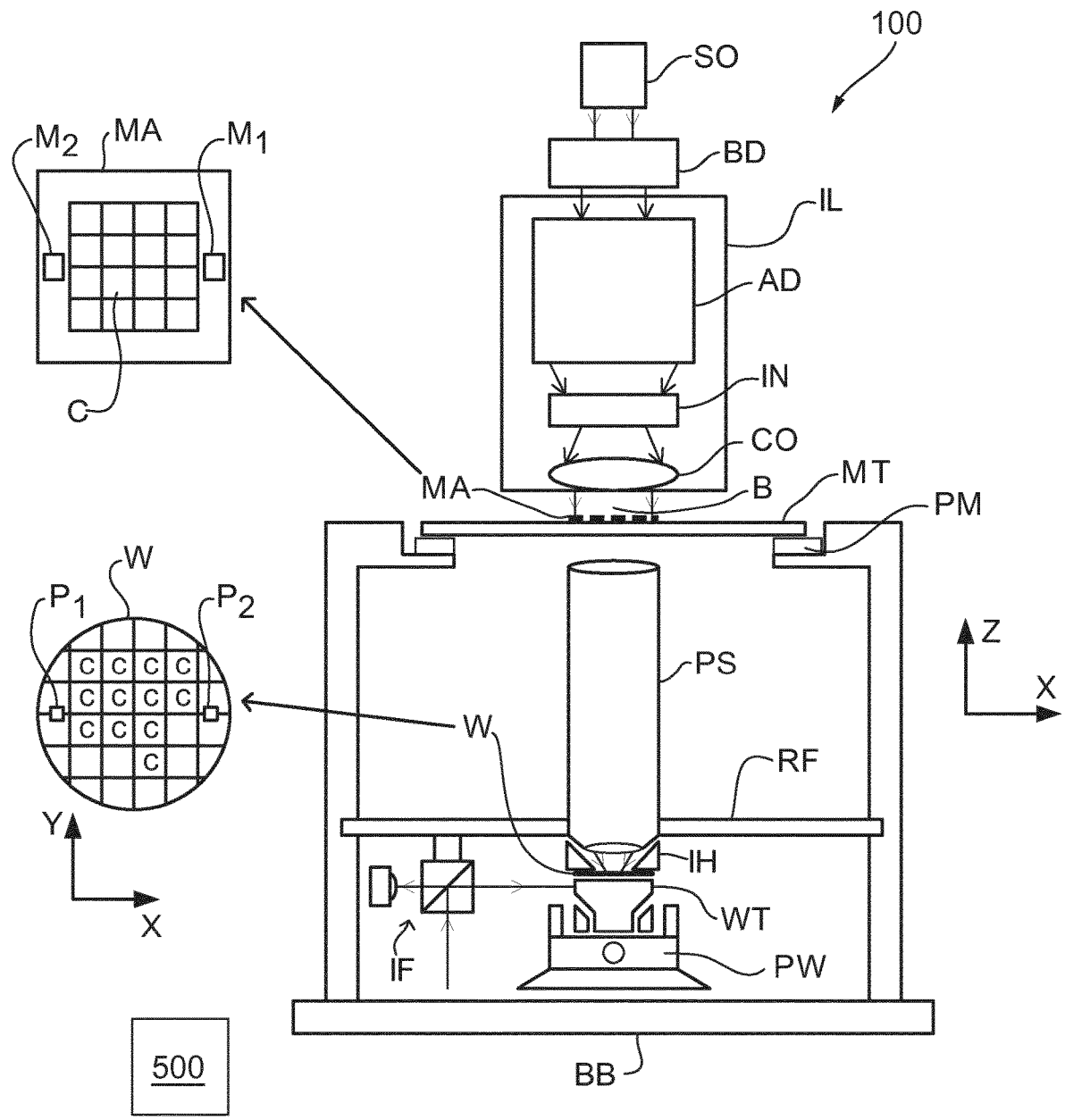
FIG. 1 depicts a lithographic apparatus 100 according to an embodiment of the invention.

FIG. 1 schematically depicts a lithographic apparatus 100 according to one embodiment of the invention. The lithographic apparatus 100 comprises:
- an illumination system (illuminator) IL configured to condition a radiation beam B (e.g. UV radiation or DUV radiation);
- a support structure (e.g. a mask table) MT constructed to support a patterning device (e.g. a mask) MA and connected to a first positioner PM configured to accurately position the patterning device MA in accordance with certain parameters;
- a support table, e.g. a sensor table to support one or more sensors or a substrate stage WT constructed to hold a substrate (e.g. a resist-coated substrate) W, connected to a second positioner PW configured to accurately position the surface of the table, for example of a substrate W, in accordance with certain parameters; and
- a projection system (e.g. a refractive projection lens system) PS configured to project a pattern imparted to the radiation beam B by patterning device MA onto a target portion C (e.g. comprising one or more dies) of the substrate W.

The illumination system IL may include various types of optical components, such as refractive, reflective, magnetic, electromagnetic, electrostatic or other types of optical components, or any combination thereof, for directing, shaping, or controlling radiation.

The support structure MT holds the patterning device MA. It holds the patterning device MA in a manner that depends on the orientation of the patterning device MA, the design of the lithographic apparatus, and other conditions, such as for example whether or not the patterning device MA is held in a vacuum environment. The support structure MT can use mechanical, vacuum, electrostatic or other clamping techniques to hold the patterning device MA. The support structure MT may be a frame or a table, for example, which may be fixed or movable as required. The support structure MT may ensure that the patterning device MA is at a desired position, for example with respect to the projection system PS. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate W, for example if the pattern includes phase-shifting features or so called assist features. Generally, the pattern imparted to the radiation beam will correspond to a particular functional layer in a device being created in the target portion, such as an integrated circuit.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the lithographic apparatus 100 is of a transmissive type (e.g. employing a transmissive mask). Alternatively, the lithographic apparatus 100 may be of a reflective type (e.g. employing a programmable mirror array of a type as referred to above, or employing a reflective mask).

The lithographic apparatus 100 may be of a type having three or more stages (or table or support), e.g., three or more substrate stages or a combination of two or more substrate stages and one or more calibration stages, cleaning stages, sensor stage or measurement stages or a combination of one or more substrate stages and two or more calibration stages, cleaning stages, sensor stages or measurement stages. For example, in an embodiment, the lithographic apparatus 100 is a multi-stage apparatus comprising three or more stages located at the exposure side of the projection system PS, each stage comprising and/or holding one or more objects. In an embodiment, one or more of the stages may hold a radiation-sensitive substrate W. In an embodiment, one or more of the stages may hold a sensor to measure radiation from the projection system PS. In an embodiment, the multi-stage lithographic apparatus 100 comprises at least one substrate stage WT configured to hold a substrate W and a calibration stage CS not configured to hold a radiation-sensitive substrate W (referred to hereinafter generally, and without limitation, as a calibration stage, measurement stage, sensor stage and/or cleaning stage). The calibration stage CS may comprise and/or may hold one or more objects, other than a substrate W. Such one or more objects may include one or more selected from the following: a sensor to measure radiation from the projection system PS, one or more fiducial marks, and/or a cleaning device (to clean, e.g., the liquid handling system IH). The fiducial mark may be used as part of a sensor system or used to calibrate a sensor system. The calibration stage CS may be smaller than the substrate. For example, a top surface of the calibration stage CS may be smaller than a surface of the substrate W comprising the target portions C.

In such "multiple stage" (or "multi-stage") machines the multiple stages may be used in parallel, or preparatory steps may be carried out on one or more stages while one or more other stages are being used for exposure. The lithographic apparatus 100 may have two or more patterning device stages which may be used in parallel in a similar manner to the substrate table WT, calibration table CS, a cleaning table, a sensor table and/or measurement table. Each patterning device stage may support a support structure MT.

Referring to FIG. 1, the illumination system IL receives a radiation beam from a radiation source SO. The radiation source SO and the lithographic apparatus 100 may be separate entities, for example when the radiation source SO is an excimer laser. In such cases, the radiation source SO is not considered to form part of the lithographic apparatus 100 and the radiation beam is passed from the radiation source SO to the illumination system IL with the aid of a beam delivery system BD comprising, for example, suitable directing mirrors and/or a beam expander. In other cases the radiation source SO may be an integral part of the lithographic apparatus 100, for example when the radiation source SO is a mercury lamp, an LED (light-emitting diode) or a set of multiple LEDs. The radiation source SO and the illumination system IL, together with the beam delivery system BD if required, may be referred to as a radiation system. An excimer laser apparatus is described, e.g., in US patent application No. US2013-0100980A1, hereby incorporated by reference. An excimer laser apparatus may be a KrF excimer laser apparatus that outputs UV laser light at a wavelength of 248 nm or an ArF excimer laser apparatus that outputs UV laser light at a wavelength of 193 nm.

The illumination system IL may comprise an adjuster AD for adjusting the angular intensity distribution of the radiation beam. Generally, at least the outer and/or inner radial extent (commonly referred to as σ-outer and σ-inner, respectively) of the intensity distribution in a pupil plane of the illumination system IL can be adjusted. In addition, the illumination system IL may comprise various other components, such as an integrator IN and a condenser CO. The illumination system IL may be used to condition the radiation beam, to have a desired uniformity and intensity distribution in its cross-section. Similar to the radiation source SO, the illumination system IL may or may not be considered to form part of the lithographic apparatus. For example, the illumination system IL may be an integral part of the lithographic apparatus or may be a separate entity from the lithographic apparatus. In the latter case, the lithographic apparatus may be configured to allow the illumination system IL to be mounted thereon. Optionally, the illumination system IL is detachable and may be separately provided (for example, by the lithographic apparatus manufacturer or another supplier).

The radiation beam B is incident on the patterning device MA, which is held on the support structure MT, and is patterned by the patterning device MA. Having traversed the patterning device MA, the radiation beam B passes through the projection system PS, which focuses the beam onto a target portion C of the substrate W. With the aid of the second positioner PW and position sensor system IF (e.g. an interferometric device, linear encoder or capacitive sensor), the support table WT can be moved accurately, e.g. so as to position different target portions C in the path of the radiation beam B. Similarly, the first positioner PM and another position sensor (which is not explicitly depicted in FIG. 1) can be used to accurately position the patterning device MA with respect to the path of the radiation beam B, e.g. after mechanical retrieval from a mask library, or during a scan. In general, movement of the support structure MT may be realized with the aid of a long-stroke module (coarse positioning) and a short-stroke module (fine positioning), which form part of the first positioner PM. Similarly, movement of the substrate stage WT may be realized using a long-stroke module and a short-stroke module, which form part of the second positioner PW. In the case of a stepper (as opposed to a scanner) the support structure MT may be connected to a short-stroke actuator only, or may be fixed. Patterning device MA and substrate W may be aligned using patterning device alignment marks $M_1$, $M_2$ and substrate alignment marks $P_1$, $P_2$. Although the substrate alignment marks $P_1$, $P_2$ as illustrated occupy dedicated target portions, they may be located in spaces between target portions C (these are known as scribe-lane alignment marks). Similarly, in situations in which more than one die is provided on the patterning device MA, the patterning device alignment marks $M_1$, $M_2$ may be located between the dies. The substrate W may have a diameter of 200 mm, 300 mm, 450 mm or any other suitable diameter. The position sensor system IF may be arranged to measure a top surface, a side surface and/or a bottom surface of the support table WT.

Figure 2:
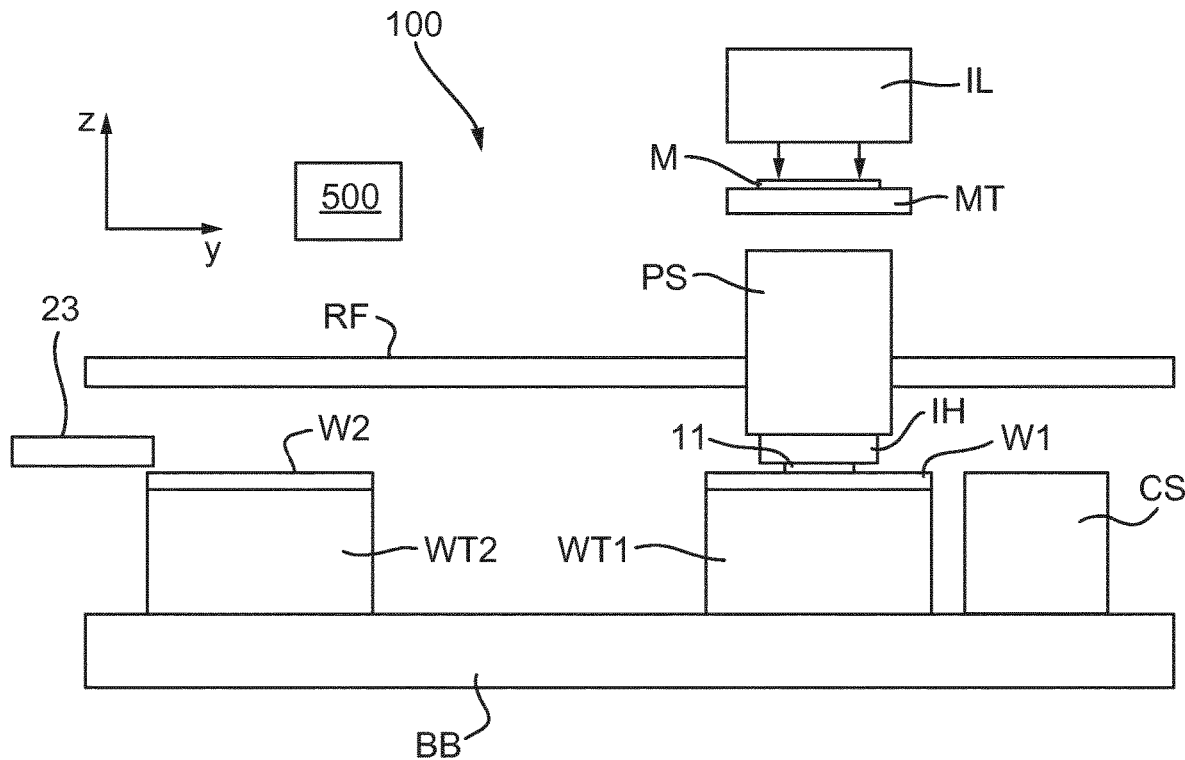
FIG. 2 schematically depicts a lithographic apparatus 100 according to an embodiment of the invention.

FIG. 2 schematically depicts a lithographic apparatus 100 according to an embodiment of the invention. The lithographic apparatus 100 may be called an exposure apparatus. The z-axis corresponds to the optical axis of the projection system PS.

The lithographic apparatus 100 comprises a first substrate stage WT1, a second substrate stage WT2 and a calibration stage CS. The first substrate stage WT1, the second substrate stage WT2 and the calibration stage CS move in the XY-plane. Each of the first substrate stage WT1 and the second substrate stage WT2 may comprise a substrate table WT. The first substrate stage WT1 is configured to move independently from the second substrate stage WT2 and the calibration stage CS. The second substrate stage WT2 is configured to move independently from the first substrate stage WT1 and the calibration stage CS. The calibration stage CS is configured to move independently from the first substrate stage WT1 and the second substrate stage WT2.

In an embodiment the lithographic apparatus 100 comprises a control system 500. The control system 500 is configured to control the first substrate stage WT1, the second substrate stage WT2 and the calibration stage CS. For example, in an embodiment the control system 500 is configured to control the relative positions of the first substrate stage WT1, the second substrate stage WT2 and the calibration stage CS.

In an embodiment the lithographic apparatus 100 comprises a base board BB as depicted in FIG. 2. The first substrate stage WT1, the second substrate stage WT2 and the calibration stage CS are configured to move on the base board BB. In use of the lithographic apparatus 100, the base board BB is oriented substantially horizontally, for example on a floor. A vibration-proof mechanism may be provided so as to reduce the effect of floor vibrations on the lithographic apparatus 100.

FIG. 2 depicts a situation in which the first substrate stage WT1 is positioned below the projection system PS, for example during an exposure operation 43 of the first substrate W1 supported by the first substrate stage WT1. The calibration stage CS is not below the projection system PS. Accordingly, the calibration stage CS does not come into contact with the first substrate stage WT1 during the exposure operation 43. The movements of the first substrate stage WT1, the second substrate stage WT2 and the calibration stage CS will be explained in more detail with reference to FIGS. 5 to 16 below.

The projection system PS is positioned below the support structure MT. In an embodiment the lithographic apparatus 100 comprises a main frame RF. The main frame RF may also be called a metrology frame or a reference frame. The main frame RF is oriented substantially horizontally and supported by a support member that is not explicitly shown in FIG. 2. In an embodiment the main frame RF forms part of the lithographic apparatus 100. However, this is not necessarily the case. In an embodiment, the main frame RF is provided as a piece of equipment separate from the lithographic apparatus 100. In an embodiment the above-mentioned vibration-proof mechanism can be positioned between the main frame RF and the support member that supports the main frame RF. In an embodiment, the position sensor system IF comprises at least one encoder head and at least one scale (or grating). One of the at least one encoder head and the at least one scale may be supported by the main frame RF, while the other of the at least one encoder head and the at least one scale may be supported by the substrate table WT.

In an embodiment the control system 500 controls the liquid handling system IH so as to control the supply of liquid between the final element of the projection system PS and the first substrate W1 (or any other substrate W during an exposure operation 43). The control system 500 is configured to control recovery of liquid from the space 11.

In an embodiment the first substrate stage WT1 has substantially the same structure as the second substrate stage WT2. The first substrate stage WT1 and the second substrate stage WT2 may have substantially the same structure as the substrate table WT described above with reference to FIG. 1. When a reference is made to substrate table WT, the reference may apply to one or both of the first substrate stage WT1 and the second substrate stage WT2.

In an embodiment the calibration stage CS is provided with at least one of a sensor and a cleaning device. The sensor may be called a measurement member. In an embodiment the calibration stage CS is provided with an illuminance irregularity sensor. The illuminance irregularity sensor is configured to detect irregularity of illuminance of the radiation beam B that is received at a pin-hole shaped light-receiving section of the illuminance irregularity sensor. In an embodiment the calibration stage CS is provided with a sensor such as an aerial image measuring device. The aerial image measuring device is configured to measure an aerial image of a pattern projected by the projection system PS. In an embodiment the calibration stage CS is provided with a sensor such as a wavefront aberration measuring device. A wavefront aberration measuring device is described in Japanese patent application Publication No. JP2003-100613A, hereby incorporated by reference. The wavefront aberration measuring device is configured to measure aberration of a wavefront, for example using a Shack-Hartmann method. In an embodiment the calibration stage CS is provided with a sensor such as an illuminance monitor. The illuminance monitor is configured to receive the radiation beam B on an image plane of the projection system PS and to measure at least one property of the radiation beam B provided by the projection system PS. In an embodiment the wavefront aberration measuring device and/or the illuminance monitor are located on the top surface of the calibration stage CS.

The calibration stage CS can be provided with one or more of the sensors described above. Further sensors can also be provided. In an embodiment the movement of the calibration stage CS is monitored and controlled using the same type of mechanisms used for the substrate stage WT. Sensors on the calibration stage CS may not only be located on the top surface of the calibration stage CS but also on the side surface of the calibration stage CS. An example of a sensor located on the side surface of the calibration stage CS is the aerial image sensor 254 described below with reference to FIG. 25.

In an embodiment the sensor is arranged to measure an aberration of the projection system PS, a pupil of the projection system PS, and/or a polarisation of the illumination system IL. When the sensor is arranged to measure the aberration of the projection system PS, a simulation model can be used to predict a distortion of an image on the substrate W. The simulation model can be used to predict a change in the aberration of the projection system PS and/or can be used to predict a distribution of an illumination pupil of the illumination system IL. The use of a simulation model is not limited to when the sensor is arranged to measure the aberration of the projection system PS. In an alternative embodiment, a uniformity sensor is used (instead of the aberration sensor) to calibrate, update or improve the simulation model. The uniformity sensor may be on the calibration stage CS. An example of a simulation model that can be used in the context of the invention is disclosed in Japanese patent application publication No. JP 2013-165134 A, hereby incorporated by reference.

In an embodiment the aberration and/or pupil of the projection system PS measured by the sensor on the calibration stage CS is utilised as input data for calibrating, updating or improving the simulation model. In an embodiment the projection system PS comprises an aberration compensator and/or an image distortion compensator. In an embodiment the aberration compensator or the image distortion compensator comprises an optical element or multiple optical elements.

In an embodiment the simulation model provides an output signal to control the aberration compensator and/or the image distortion compensator. The output signal may be used for a feedforward control of the aberration compensator and/or the image distortion compensator. Alternatively or in addition, the output signal may be used for a feedforward control of a position and/or shape of an optical element in the projection system PS. Merely as an example, in an embodiment the aberration compensator comprises a deformable mirror in an optical path of the radiation beam B, e.g., including the projection system PS. As an alternative or in addition, in an embodiment the aberration compensator comprises a locally-temperature-controlled lens element in an optical path of the radiation beam B.

In an embodiment the projection system PS is catadioptric. In an embodiment the projection system PS comprises two or three or four reflective surfaces in the optical path of the radiation beam B. In an embodiment the projection system PS is a multi-axis system. When the projection system PS comprises three reflective surfaces (or any other odd number of reflective surfaces), the pattern of the radiation beam B is inverted.

In an embodiment the projection system PS is catadioptric and comprises a deformable mirror. A catadioptric projection system comprising a deformable mirror is described in the Japanese patent application Publication No. JP 2013-161992A and in PCT-application publication No. WO 2015/041335A1, hereby both incorporated by reference. The deformable mirror may be called a quick reflex mirror. In an embodiment the deformable mirror comprises at least one piezoelectric element configured to deform the deformable mirror. In an embodiment the control system 500 is configured to control the piezoelectric element so as to control deformation of the deformable mirror. In an embodiment the deformable mirror is located on the pupil plane of the projection system PS. In an embodiment the control system 500 is configured to control a thermal aberration during an exposure operation 43 by controlling the deformation of the deformable mirror. The deformable mirror may be an adaptive optical element. In an embodiment, the projection system PS has a double-sided mirror. The double-sided mirror comprises two reflective surfaces. In addition to the double-sided mirror, the projection system PS may have two deformable mirrors.

In an alternative embodiment the projection system PS comprises two folding mirrors. Each folding mirror may comprise two reflective surfaces. Hence, the projection system PS comprises four reflective surfaces. When the projection system PS comprises four reflective surfaces (or any other even number of reflective surfaces) in the optical path of the radiation beam B, the passing of the radiation beam B is not inverted, i.e., the passing of the radiation beam B is not flipped).

As mentioned, in an embodiment the control system 500 is configured to perform feedforward control of thermal aberrations using a deformable mirror in the projection system PS. In an embodiment, the control system 500 is configured to optimise a thermal aberration control parameter based on either a wavefront or on a specific patterning device MA, so that a stable self-correction can be achieved for a whole batch of substrates W. In an embodiment the control system 500 receives data about the patterning device MA. The control system 500 is configured to use a fast Fourier transform algorithm to compute the discrete Fourier transform of the pattern of the patterning device MA. Alternatively, the control system 500 is provided with the result of the fast Fourier transform algorithm. In an embodiment the control system 500 is configured to calculate a diffracted pupilgram from the fast Fourier transform calculation of the patterning device MA. A pupilgram comprises intensity data for a pupil fill. When a pupilgram is visually represented, it offers a visualisation of the performance of the illumination system IL. Alternatively, the control system 500 may be provided with the diffracted pupilgram information.

In an embodiment the control system 500 is configured to predict visual aberrations from the diffracted pupilgram information. In an embodiment the control system 500 is configured to use the thermal aberration control parameter so as to optimise the projection system PS based on both wavefront and pattern-specific imaging performance. The deformable mirror is controlled by the control system 500 in order to correct for the thermal aberration.

Additionally or alternatively, in an embodiment the control system 500 is configured to perform feedforward control of lens aberrations using a deformable mirror in the projection system PS.

Instead of or in addition to using a deformable mirror, a locally-temperature-control lens element can be used for performing control of aberrations, for example feedforward control. In an embodiment, the lithographic apparatus 100 comprises an infrared laser configured to deliver a thermal load to at least one lens of the projection system PS. In an embodiment the infrared laser is connected to the least one lens by at least one optical hollow fibre so as to deliver the thermal load. In an embodiment the control system 500 is configured to control the infrared laser so as to heat the at least one lens selectively. In an embodiment the control system 500 is configured to control the infrared laser in order to correct for effects such as the uniform astigmatism caused by dipole-like illumination, as well as caused by other exposure conditions.

As depicted in FIG. 2, the lithographic apparatus 100 comprises the illumination system IL, the support structure MT, the projection system PS and the liquid handling system IH. The illumination system IL, support structure MT and projection system PS are as described above in context of FIG. 1. The liquid handling system IH will be further described below with particular reference to FIGS. 3 and 4.

Although specific reference may be made in this text to the use of a lithographic apparatus in the manufacture of ICs, it should be understood that the lithographic apparatus 100 described herein may have other applications in manufacturing components with microscale, or even nanoscale, features, such as the manufacture of integrated optical systems, guidance and detection patterns for magnetic domain memories, flat-panel displays, liquid-crystal displays (LCDs), thin-film magnetic heads, etc.

Arrangements for providing liquid between a final element of the projection system PS and the substrate W can be classed into three general categories. These are i) the bath type arrangement, ii) the so-called localized immersion system and iii) the all-wet immersion system. In a bath type arrangement substantially the whole of the substrate W and optionally part of the substrate stage WT is submersed in a bath of liquid.

Figure 3:
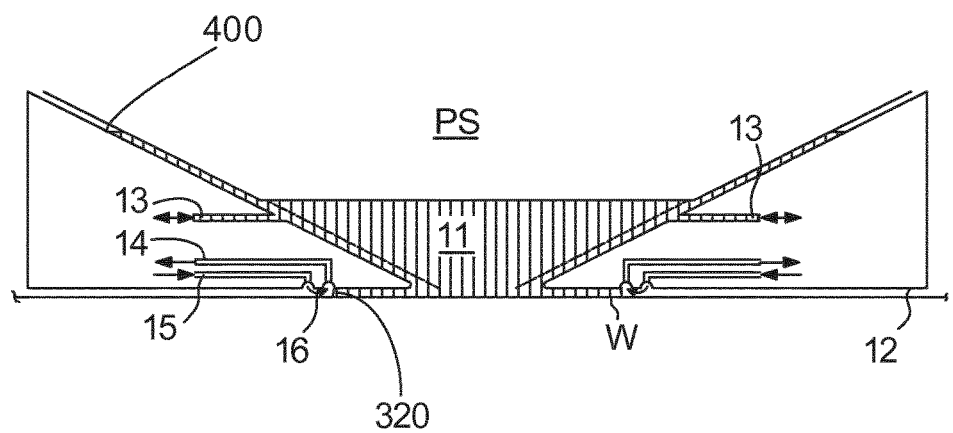
FIG. 3 depicts a liquid handling system for use in a lithographic apparatus 100 according to an embodiment of the invention.
Figure 4:
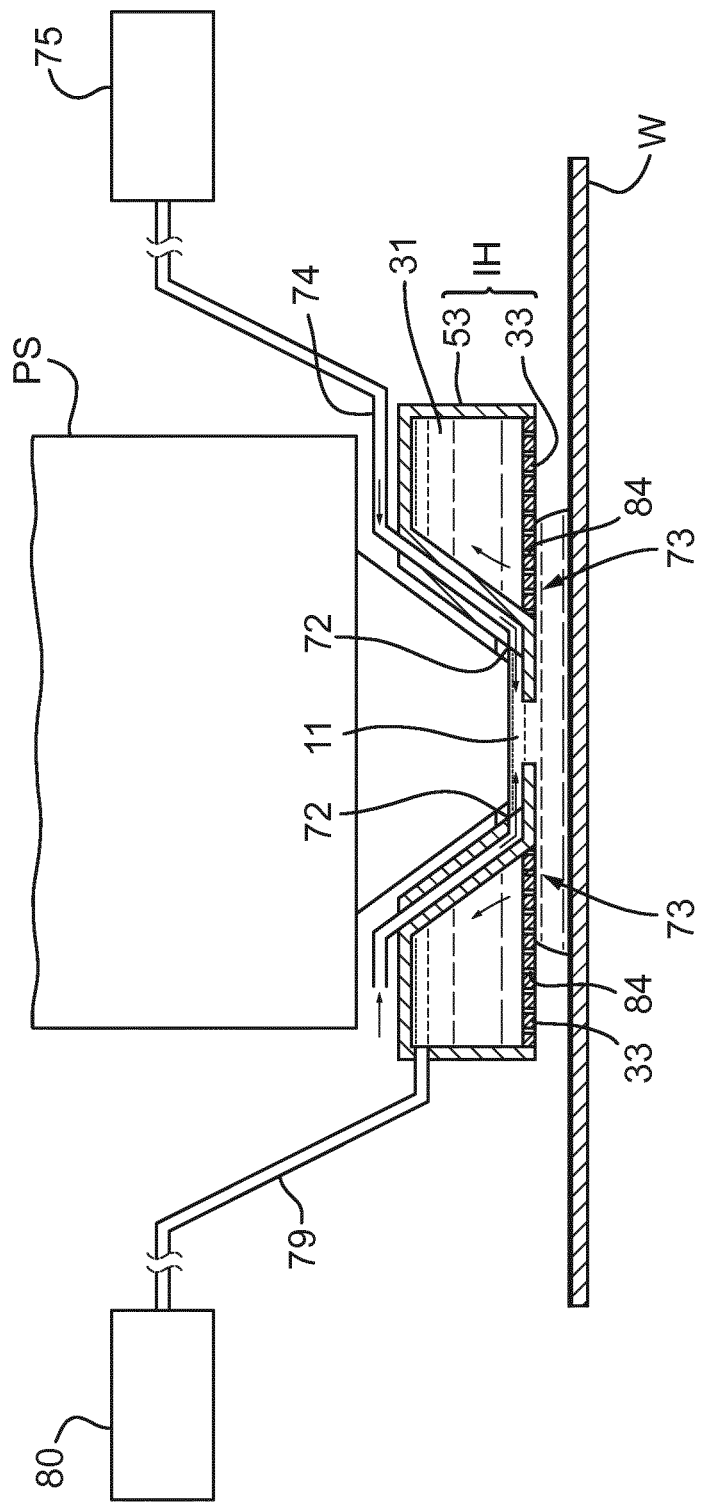
FIG. 4 is a side cross-sectional view that depicts a further liquid handling system for use in a lithographic apparatus 100 according to an embodiment of the invention.

A localized immersion system uses a liquid handling system IH in which liquid is only provided to a localized area of the substrate W. The space filled by liquid is smaller in plan than the top surface of the substrate W and the area filled with liquid remains substantially stationary relative to the projection system PS while the substrate W moves underneath that area. FIGS. 3 and 4 show different liquid handling systems which can be used in such a system. A sealing feature is present to seal liquid to the localized area. One way which has been proposed to arrange for this is disclosed in PCT-application publication No. WO 99/49504.

An arrangement which has been proposed is to provide the liquid handling system IH with a liquid confinement structure which extends along at least a part of a boundary of a space between the final element of the projection system PS and the substrate table WT. Such an arrangement is illustrated in FIG. 3. The boundary of the space may be defined between the projection system PS and at least one of the first substrate W1, the second substrate W2, the first stage W1, the second stage W2 and the calibration stage CS.

FIG. 3 schematically depicts a localized liquid handling system IH, which in may be more generally referred to as a fluid handling system. The liquid handling system IH is provided with a liquid confinement structure, which extends along at least a part of a boundary of the space 11 between the final element of the projection system PS and the substrate stage WT or substrate W. (Please note that reference in the following text to surface of the substrate W also refers in addition or in the alternative to a surface of the substrate stage WT or another stage such as a calibration stage CS, unless expressly stated otherwise.) The liquid handling system IH is substantially stationary relative to the projection system PS in the XY plane though there may be some relative movement in the Z direction (in the direction of the optical axis). In an embodiment, a seal is formed between the liquid handling system IH and the surface of the substrate W and may be a contactless seal such as a gas seal (such a system with a gas seal is disclosed in European patent application publication No. EP-A-1,420,298) or liquid seal.

The liquid handling system IH at least partly contains liquid in the space 11 between the final element of the projection system PS and the substrate W. A contactless seal 16 to the substrate W may be formed around the image field of the projection system PS so that liquid is confined within the space 11 between the substrate W surface and the final element of the projection system PS. The space 11 is at least partly formed by the liquid handling system IH positioned below and surrounding the final element of the projection system PS. Liquid is brought into the space 11 below the projection system PS and within the liquid handling system IH by one of liquid inlets 13. The liquid may be removed by another of liquid outlets 13. The liquid may be brought into the space 11 through at least two liquid inlets 13. Which of liquid openings 13 is used to supply the liquid and optionally which is used to remove the liquid may depend on the direction of motion of the substrate stage WT. The liquid handling system IH may extend a little above the final element of the projection system PS. The liquid level rises above the final element so that a buffer of liquid is provided. In an embodiment, the liquid handling system IH has an inner periphery that at the upper end closely conforms to the shape of the projection system PS or the final element thereof and may, e.g., be round. At the bottom, the inner periphery closely conforms to the shape of the image field, e.g., rectangular, though this need not be the case.

The liquid may be contained in the space 11 by a gas seal 16 which, during use, is formed between the bottom of the liquid handling system IH and the surface of the substrate W. The gas seal 16 is formed by gas. The gas in the gas seal 16 is provided under pressure via inlet 15 to the gap between the liquid handling system IH and substrate W. The gas is extracted via outlet 14. The overpressure on the gas inlet 15, vacuum level on the outlet 14 and geometry of the gap are arranged so that there is a high-velocity gas flow inwardly that confines the liquid. The force of the gas on the liquid between the liquid handling system IH and the substrate W contains the liquid in the space 11. The inlets/outlets may be annular grooves which surround the space 11. The annular grooves may be continuous or discontinuous. The flow of gas is effective to contain the liquid in the space 11. Such a system is disclosed in United States patent application publication No. US 2004/0207824 A1, which is hereby incorporated by reference in its entirety. In an embodiment, the liquid handling system IH does not have a gas seal.

FIG. 4 is a side cross-sectional view that depicts a further liquid handling system IH according to an embodiment. The arrangement illustrated in FIG. 4 and described below may be applied to the lithographic apparatus 100 described above and illustrated in FIG. 1 or FIG. 2. The liquid handling system IH extends along at least a part of a boundary of the space 11 between the final element of the projection system PS and the substrate stage WT or substrate W. (Please note that reference in the following text to surface of the substrate W also refers in addition or in the alternative to a surface of the substrate stage WT or the calibration stage CS, unless expressly stated otherwise.)

The liquid handling system IH at least partly contains liquid in the space 11 between the final element of the projection system PS and the substrate W. The space 11 is at least partly formed by the liquid handling system IH positioned below and surrounding the final element of the projection system PS. In an embodiment, the liquid handling system IH comprises a main body member 53 and a porous member 33. The porous member 33 is plate shaped and has a plurality of holes (i.e., openings or pores). In an embodiment, the porous member 33 is a mesh plate wherein numerous small holes 84 are formed in a mesh. Such a system is disclosed in United States patent application publication No. US 2010/0045949 A1, which is hereby incorporated by reference in its entirety.

The main body member 53 comprises supply ports 72, which are capable of supplying the liquid to the space 11, and a recovery port 73, which is capable of recovering the liquid from the space 11. The supply ports 72 are connected to a liquid supply apparatus 75 via passageways 74. The liquid supply apparatus 75 is capable of supplying the liquid to the supply ports 72. The liquid that is fed from the liquid supply apparatus 75 is supplied to each of the supply ports 72 through the corresponding passageway 74. The supply ports 72 are disposed in the vicinity of the optical path at prescribed positions of the main body member 53 that face the optical path. The recovery port 73 is capable of recovering the liquid from the space 11. The recovery port 73 is connected to a liquid recovery apparatus 80 via a passageway 79. The liquid recovery apparatus 80 comprises a vacuum system and is capable of recovering the liquid by using suction via the recovery port 73. The liquid recovery apparatus 80 recovers the liquid recovered via the recovery port 73 through the passageway 79. The porous member 33 is disposed in the recovery port 73.

In an embodiment, liquid is supplied from the supply ports 72 to form the space 11 with the liquid between the projection system PS and the liquid handling system IH on one side and the substrate W on the other side. The pressure in a recovery chamber 31 in the liquid handling system IH is adjusted to a negative pressure so as to recover the liquid via the recovery port 73, e.g., holes 84 of the porous member 33. In other words, the space 11 between the projection system PS and the substrate W is formed by performing the liquid supply operation (using the supply ports 72) and the liquid recovery operation (using the porous member 33).

As depicted in the Figures, the lithographic apparatus 100 may be of an immersion type. Alternatively, the lithographic apparatus 100 may be of a dry type in which the substrate W is not immersed in a liquid. In a dry type lithographic apparatus 100 a gas may be supplied between the projection system PS and the substrate W. The gas may be air, helium, $CO_2$ (carbon dioxide) or nitrogen and may be used for conditioning the space between the projection system and the substrate W.

Figure 5:
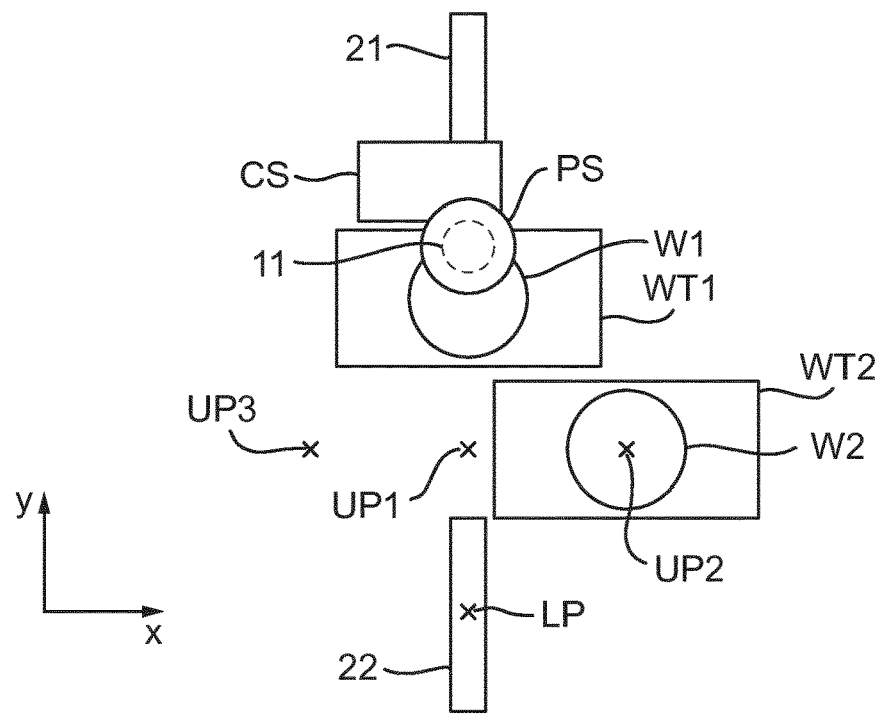
FIGS. 5 to 13 schematically depict, in plan, a lithographic apparatus 100 using a three-stage system at various times during operation.

FIG. 5 schematically depicts, in plan, positions of the calibration stage CS, the projection system PS, the first substrate stage WT1 and the second substrate stage WT2 in the lithographic apparatus 100. In FIG. 5 (and also in FIGS. 6 to 16), the symbol "X" is used to mark particular positions within the lithographic apparatus 100.

In an embodiment the lithographic apparatus 100 comprises a first position measurement system. The first measurement system comprises a back-side encoder system. The back-side encoder system comprises a first measurement arm 21 as depicted in FIGS. 5 to 16. In an embodiment the first measurement arm 21 is supported in a cantilevered state. In an embodiment the first measurement arm 21 is fixedly attached to the main frame RF. In an embodiment a location near the tip of the first measurement arm 21 is at the optical axis of the projection system PS. In an embodiment the lithographic apparatus 100 comprises a second position measurement system that comprises a second back-side encoder system having a second measurement arm 22. In an embodiment the second measurement arm 22 is supported in a cantilevered state. In an embodiment the second measurement arm 22 is fixedly attached to the main frame RF. In an embodiment a location near the tip of the second measurement arm 22 is at a position where a substrate alignment and/or levelling operation 44 is performed.

In an embodiment the calibration stage CS is engageable with the first measurement arm 21. When the calibration stage CS is engaged with the first measurement arm 21 the calibration stage CS is positioned above the first measurement arm 21. The first measurement arm 21 forms part of a system used to measure position information of the calibration stage CS. In an embodiment the first measurement arm 21 comprises a scale (or grating). When the calibration stage CS is engaged with the first measurement arm 21, a plurality of encoder heads measure the position of the calibration stage CS in three dimensions. In an embodiment the measurements are performed by the encoder heads irradiating a measurement beam of radiation on the scale of the first measurement arm 21. In an embodiment, at least one encoder head is arranged on the first measurement arm 21.

In an embodiment, at least one scale is arranged on a bottom side of the calibration stage CS and/or on the first substrate stage WT1 and/or the second substrate stage WT2.

The position information of the calibration stage CS is received by the control system 500. The control system 500 is configured to control the position of the calibration stage CS taking into account the position information of the calibration stage CS. For example, in an embodiment the control system 500 is configured to control a positioner (e.g. of the same type as the second positioner PW described above) to control movement of the calibration stage CS.

The second measurement arm 22 comprises an arm member that is supported by the main frame RF. The arm member may be arranged in a cantilevered state. In an embodiment, the second measurement arm 22 comprises an optical system such as an encoder head. In an embodiment the second measurement arm 22 houses the optical system. A measurement beam is irradiated from a section facing a scale so as to measure position information of the first substrate stage WT1 and/or the second substrate stage WT2. This position information is fed to the control system 500 that is configured to control the position of the first substrate stage WT1 and the second substrate stage WT2.

The unloading position UP1 defines a position at which a substrate W can be removed from a substrate stage WT (e.g. the first substrate stage WT1 or the second substrate stage WT2), e.g. using a vertical movement pin. In an embodiment the short-stroke module of the second positioner PW of each substrate stage comprises a vertical movement pin. Alternatively, the long-stroke module of the second positioner PW comprises the vertical movement pin. The vertical movement pin is configured to move vertically (i.e. along the z-axis). The vertical movement pin is configured to move between a hidden position where the top of the vertical movement pin is below the supporting surface of the substrate stage WT and a protruding position where the top of the vertical movement pin protrudes above the supporting surface of the substrate stage WT. The vertical movement pin extends through a vertical hole terminating at the supporting surface of the substrate stage WT. Accordingly, when the vertical movement pin is moved from the hidden position to the protruding position, the vertical movement pin moves the substrate W above the supporting surface of the substrate stage WT. In an embodiment a plurality of vertical movement pins are provided in order to improve stability of the movement of the substrate W away from the supporting surface of the substrate stage.

In an embodiment at the unloading position UP1 the vertical movement pin supports the substrate W above the supporting surface of the substrate stage WT. A substrate unloader 23 is configured to unload the substrate W from the substrate stage WT. For example in an embodiment the substrate unloader 23 is configured to grasp the edge of the substrate W and move the substrate W upwards. In an embodiment, the substrate unloader 23 is arranged to grasp the substrate W at the top surface, i.e., the surface having the target portions C. The substrate unloader 23 may be a Bernoulli-type unloader arranged to grasp the substrate W with a vacuum force. Alternatively or in addition, the substrate unloader 23 is arranged to provide a gas film between the substrate unloader 23 and the substrate W to prevent physical contact between the substrate unloader 23 and the substrate W. A Bernoulli-type unloader is described in PCT-application publication No. WO 2013/100203A2, hereby incorporated by reference. The substrate unloader 23 may comprise a robotic arm or a plurality of robotic arms, configured to support the backside of the substrate W. A substrate unloader 23 having two robotic arms is described in PCT-application publication No. WO 2004/088741A1, hereby incorporated by reference.

At the first waiting position UP2, the substrate W unloaded from the substrate WT can be held and subsequently moved to an external device through a path at the edge on the +X side above the base board BB. At the second waiting position UP3, a substrate W unloaded from the substrate stage WT can be held and carried to an external device through a path at the edge on the −X side above the base board BB. At the loading position LP, a substrate W can be loaded onto a substrate stage WT.

As depicted in FIG. 5, the second substrate stage WT2 supports a second substrate W2. At this point in the operation sequence for the lithographic apparatus 100, the second substrate W2 has not undergone an exposure operation 43. However, other operations such as substrate alignment, substrate levelling and/or focus mapping have been performed on the second substrate W2 in preparation for the exposure operation 43. The second substrate stage WT2 supports the second substrate W2 at a predetermined standby position, for example at the first waiting position UP2.

The first substrate stage WT1 supports the first substrate W1 undergoing an exposure operation 43. During the exposure operation, the control system 500 is configured to control movement of the first substrate stage WT1 along a predetermined meandering path. During the exposure operation, target portions C of the first substrate W1 are exposed.

The order of exposing the target portions C of the first substrate W1 is not particularly limited. As an example, the target portions C at the −X side of the first substrate W1 are exposed before the target portions C on the +X side of the first substrate W1. When the target portions C on the −X side of the first substrate W1 are exposed, the target portions C at the +Y side are exposed before the target portions at the −Y side. When the target portions C on the +X side of the first substrate W1 are being exposed, the target portions C on the −Y side are exposed before the target portions on the +Y side. When all of the target portions C of the first substrate W1 have been exposed, the control system 500 is configured to move the first substrate stage WT1 to a position at which the first substrate stage WT1 was before any of the target portions C were exposed.

During the exposure operation 43 for the first substrate W1, another substrate W that has already undergone the exposure operation 43 is moved from the second waiting position UP3 to an external device such as a substrate carrier system in order to carry the exposed substrate outside of the lithographic apparatus 100.

During the exposure operation 43 for the first substrate W1, the control system 500 is configured to control movement of the calibration stage CS towards the first substrate stage WT1 to the position at which the calibration stage CS is shown in FIG. 5. The calibration stage CS engages with the first measurement arm 21 from the side (i.e. laterally).

Figure 6:
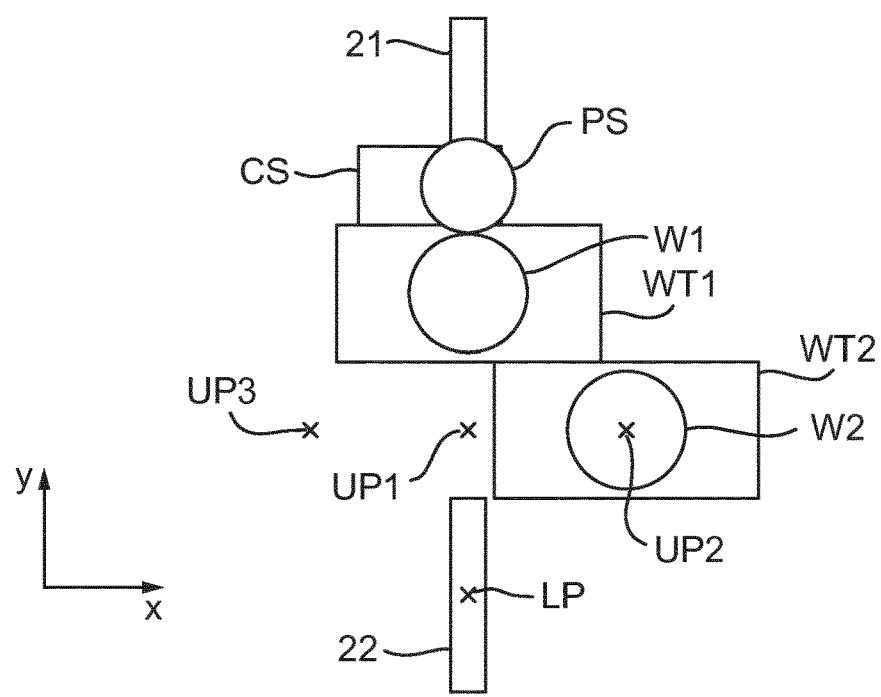

As shown in FIG. 6, the calibration stage CS is brought into contact or proximity with the first substrate stage WT1. The calibration stage CS is brought into contact or proximity with the first substrate stage WT1 in order to perform what is known as a post-exposure scrum sweep operation 48. FIG. 6 shows the position of the stages during the post-exposure scrum sweep operation 48. During the post-exposure scrum sweep operation, the control system 500 is configured to move (i.e. control the movement of) the calibration stage CS in the −Y direction at the same time as moving the substrate stage WT1 in both the −Y direction and the −X direction.

During the movements of the calibration stage CS and the first substrate stage WT1, the contact or proximity of the calibration stage CS with the first substrate stage WT1 is maintained. The purpose of the post-exposure scrum sweep operation 48 is to move the space 11, where the immersion liquid is confined, from a position above the first substrate stage WT1 to a position above the calibration stage CS.

It may not be necessary for the first substrate stage WT1 to be moved in the −X direction in order for the immersion liquid confined within the space 11 to be moved to be above the calibration stage CS. However, by moving the first substrate stage WT1 in the −X direction (as well as in the −Y direction), the time taken until completion of the stage swapping operation 42 can be reduced. The stage swapping operation 42 involves the positions of the first substrate stage WT1 and the second substrate stage WT2 being swapped (i.e. exchanged). In general terms the stage swapping operation is performed by moving the first substrate stage WT1 and the second substrate stage WT2 in the anti-clockwise direction (although alternatively the clockwise direction can be used). Hence, by moving the first substrate stage WT1 in the −X direction, this anti-clockwise movement of the first substrate stage WT1 is effectively already started, getting a head-start on the substrate swapping operation. The substrate swapping operation 42 is shown by the movements of the first substrate stage WT1 and the second substrate stage WT2 in FIGS. 6 to 9.

Once the post-exposure scrum sweep operation 48 has been completed, the immersion liquid confined in the space 11 is above the calibration stage CS. When the immersion liquid confined in the space 11 is above the calibration stage CS, the control system 500 is configured to control the position of the calibration stage CS. The control system 500 is configured to perform measurement operations, related to exposure and/or a cleaning operation using the calibration stage, while controlling the position of the calibration stage CS in three dimensions.

In an embodiment, the calibration stage CS accommodates a component that includes at least one of a sensor and a cleaning device. Instead of performing a measurement, the calibration stage CS can alternatively be used to perform a cleaning operation. As a further alternative, both a measurement operation and a cleaning operation can be performed by the calibration stage CS while the calibration stage CS is below the projection system PS.

Figure 7:
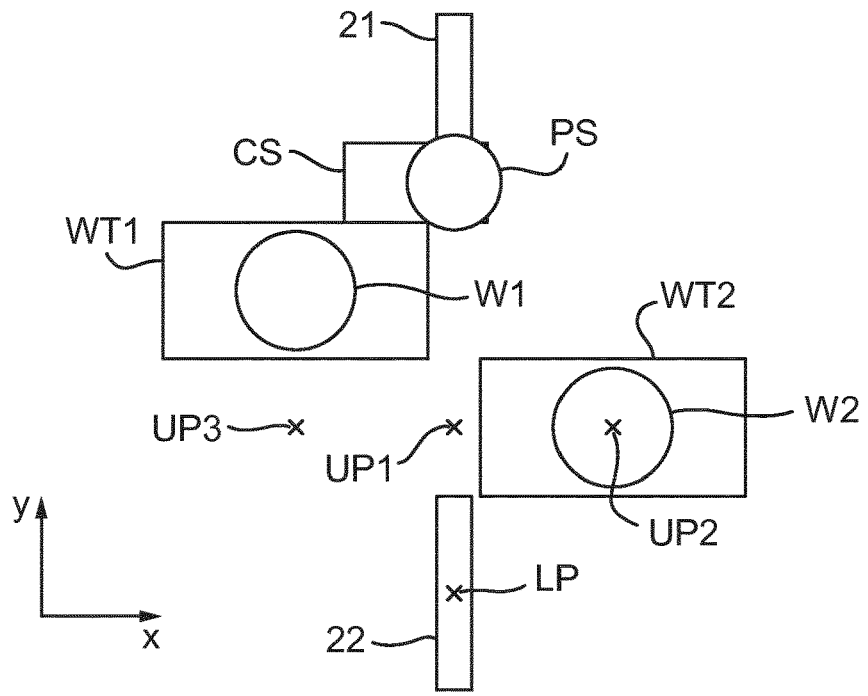

From the situation shown in FIG. 6, the control system 500 moves the first substrate stage WT1 in the −X direction to a position where the first substrate stage WT1 does not overlap the second substrate stage WT2 when viewed in the +Y direction. Such a position is shown in FIG. 7. As shown in FIG. 7, the second substrate stage WT2 is positioned at the first waiting position UP2, which is the standby position.

Figure 8:
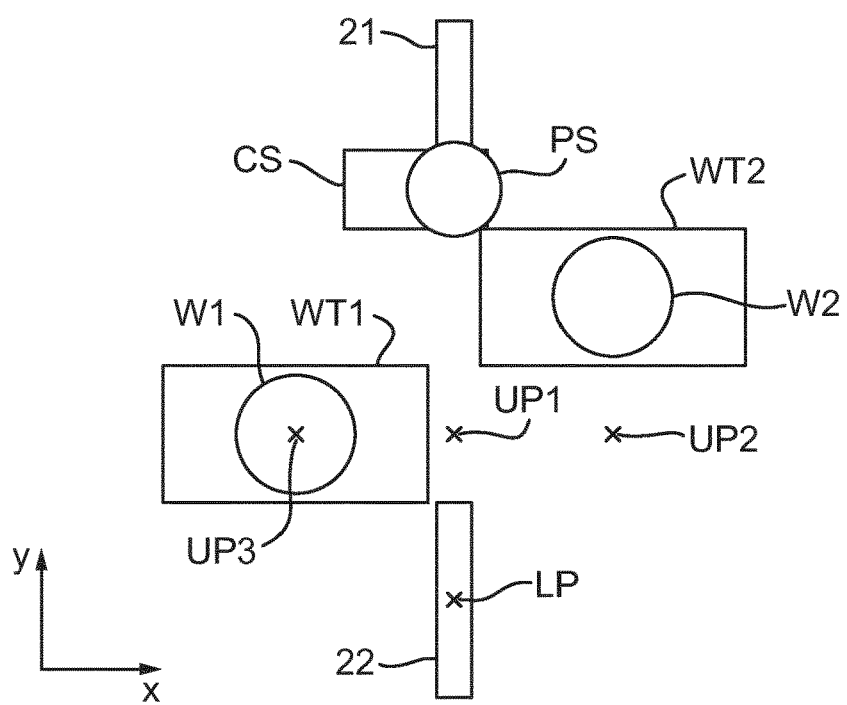

Starting from the situation shown in FIG. 7, the control system 500 is configured to move the second substrate stage WT2 in the +Y direction at the same time as moving the first substrate stage WT1 in the −Y direction. Moving the first substrate stage WT1 in the −Y direction results in the calibration stage CS no longer being in contact or proximity with the first substrate stage WT1. The control system 500 is configured to move the first substrate stage WT1 to the second waiting position UP3 at the same time as moving the second substrate stage WT2 to a position where at least a corner of the second substrate stage WT2 is in contact or proximity with the calibration stage CS, as shown in FIG. 8. The control system 500 is configured to move the second substrate stage WT2 in the −X direction at the same time as moving the first substrate stage WT1 in the +X direction.

This movement continues the anti-clockwise movement of the first substrate stage WT1 and the second substrate stage WT2 during the stage swapping operation 42. The control system 500 is configured to move the first substrate stage WT1 from the second waiting position UP3 to the unloading position UP1, as shown in FIG. 9.

The control system 500 is configured to move the second substrate stage WT2 to a position where the second substrate stage WT2 is aligned with the first substrate stage WT1 along the Y axis. The second substrate stage WT2 is maintained in contact or proximity with the calibration stage CS.

Figure 9:
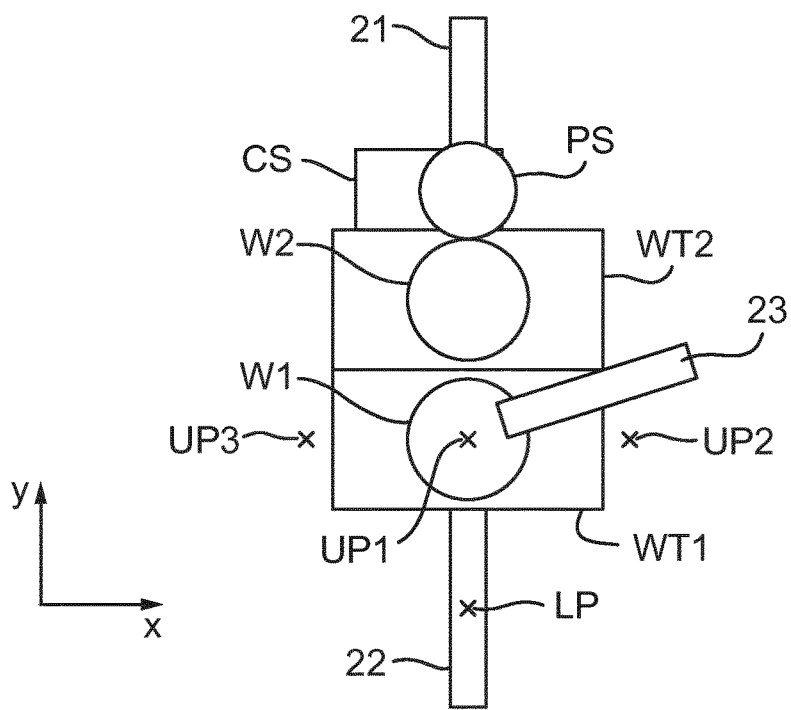

FIG. 9 depicts the situation before a pre-exposure scrum sweep operation 47 in which the calibration stage CS and the second substrate stage WT2 are moved such that the confined immersion liquid is transferred from the calibration stage CS to the second substrate stage WT2. The confined immersion liquid is the immersion liquid confined in the space 11. FIG. 9 depicts a moment when the sensing and/or cleaning operation 45 is being performed at the calibration stage CS at the same time as a substrate exchange operation 41 is being performed at the first substrate stage WT1. Only the calibration stage CS is located at the projection system PS. The second substrate stage WT2 is not yet involved in the pre-exposure scrum sweep operation 47 with the calibration stage CS. During the time period when the confined immersion liquid is above the calibration stage CS, the control system 500 is configured to use at least one sensor and/or cleaning device included in a component accommodated on the calibration stage CS so as to perform at least one measurement operation and/or a cleaning operation. For example, at least one measurement related to exposure such as an uneven illuminance measurement, an aerial image measurement, a wavefront operation measurement and a dose measurement can be performed, and/or a cleaning operation can be performed.

When the first substrate stage WT1 is at the unloading position UP1, the control system 500 is configured to perform a substrate unloading operation. During the substrate unloading operation, the first substrate W1 is removed from the first substrate stage WT1. The method for unloading the first substrate W1 from the first substrate stage WT1 is not particularly limited. As an example, if a vacuum clamping system is used, the control system 500 is configured to release suction holding the first substrate W1 to part (e.g. a burl plate) of the first substrate stage WT1. The vertical movement pin (described previously) can be used to lift the first substrate W1 from the supporting surface of the first substrate stage WT1.

The control system 500 is configured to control a substrate unloader 23 to unload (e.g. lift) the first substrate W1 from the vertical movement pin. The control system 500 is configured to keep the first substrate W1 above the unloading position UP1 while moving the first substrate stage WT1 from the unloading position UP1 to the loading position LP.

FIG. 23 is a diagram showing an operational sequence of a three-stage system for the lithographic apparatus 100 according to an embodiment of the invention. FIG. 22 is a comparative example. In FIG. 22 and FIG. 23, time is represented left to right. The three rows correspond to different operations of the three stages and corresponding positions within the lithographic apparatus 100. The top row schematically represents the operations for preparing a new (pre-exposed) substrate W2 on the substrate stage WT2 for exposure or for preparing a new (pre-exposed) substrate W3 on the first stage WT1 for exposure. The middle row schematically represents the operations for exposing a substrate W1, for which preparatory operations (including the substrate alignment and/or levelling operation 44) have already been performed on the first substrate stage WT1. Alternatively, the middle row schematically represents the operations for exposing the substrate W2, for which preparatory operations have already been performed on the first substrate stage WT2. The bottom row schematically represents the operations of the calibration stage CS. In a three-stage system, two substrate stages and one calibration stage perform these three different types of operations simultaneously at a given moment of time. The bars (or blocks) in each row indicate relative timings of when different operations start and finish. When a single operation gets involved with multiple stages, such an operation is represented as a bar (or a block) that occupies multiple rows in the diagrams. When an operation does not get involved with any stages (e.g., an operation performed by a substrate unloader), the corresponding bar (or block) may be indicated in the fourth row or any other appropriate part of the diagrams. The bars do not indicate the absolute length of time spent on each operation.

As shown in the sequence from FIG. 5 to FIG. 9, the control system 500 is configured to swap the locations of the first substrate stage WT1 and the second substrate stage WT2 in a stage swapping operation 42. Subsequently, the control system 500 is configured to operate the substrate unloader 23 to unload the first substrate W1 from the first substrate stage WT1 in a substrate exchange operation 41. In an embodiment the calibration stage CS is located underneath or in the proximity of the projection system PS at the moment that the substrate unloader 23 starts to be operated. The control system 500 does not wait for the sensing and/or cleaning operation 45 performed at the calibration stage CS to be finished before initiating the substrate exchange operation by starting to operate the substrates unloader 23. This feature is shown in FIG. 23 where the sensing and/or cleaning operation 45 overlaps the substrate exchange operation 41 in time. Accordingly, the substrate exchange operation can be completed at an earlier time.

The inventor of the present invention has found that the time spent for performing the stage swapping operation 42 and the substrate exchange operation 41 is pure overhead time. This means that there is no discernible improvement in imaging quality regardless of how long is spent performing the stage swapping operation 42 and the substrate exchange operation 41. On the other hand, by allowing more time for performing a sensing operation at the calibration stage CS, an improvement in image quality can be provided. Additionally, by allowing more time for performing a cleaning operation at the calibration stage CS, an improvement in yield and/or uptime of the lithographic apparatus 100 can be provided. Similarly, given less overhead time that prevents a longer takt time, i.e. an overall time to process a substrate or a pair of substrates, the image quality during the exposure operation 43 can be improved by spending more time performing the exposure operation 43 and the substrate alignment and/or levelling operation 44. Alternatively, by not spending more time performing the exposure operation 43 and the substrate alignment and/or levelling operation 44, throughput can be improved since the reduced overhead time directly reduces a takt time. In other words, the time spent for substrate alignment, levelling, sensing and exposure involves a trade-off between throughput and imaging quality, whereas the time spent for stage swapping and substrate exchange is pure overhead time.

In an embodiment, the calibration stage CS is positioned below the confined immersion liquid for a longer time than it takes to perform the stage swapping operation 42. In general, the stage swapping operation 42 is performed at the same time as the sensing and/or cleaning operation 45 is performed while the calibration stage CS is below the confined immersion liquid (e.g. as shown in FIGS. 6 to 9). Imaging quality can be improved by spending a longer time performing the sensing and/or cleaning operation 45 at the calibration stage CS. However, no benefit is derived by spending a longer time performing the stage swapping operation 42. By positioning the calibration stage CS below the confined immersion liquid for a longer time than it takes to perform the stage swapping operation 42, image quality can be improved. This feature is shown in FIG. 23 where the sensing and/or cleaning operation 45 is longer in time than the stage swapping operation 42.

As shown in FIG. 23, in an embodiment the substrate exchanging operation 41 is performed during a time period that overlaps with the time period for the sensing and/or cleaning operation 45 performed at the calibration stage CS. In an embodiment the substrate exchange operation 41 is configured to start immediately after the stage swapping operation 42 has been performed, while the calibration stage CS performs the sensing and/or cleaning operation 45. Accordingly, the first substrate stage WT1, supporting a third substrate W3, can begin the substrate alignment and/or levelling operation 44 at an earlier stage, as the third substrate W3 is loaded to the first substrate stage WT1 at an earlier stage.

In comparison, if the pre-exposure scrum sweep operation 47 starts at the same time as the substrate exchange operation 41, as shown in FIG. 22, then the substrate alignment and/or levelling operation 44 begins at a later stage.

Figure 10:
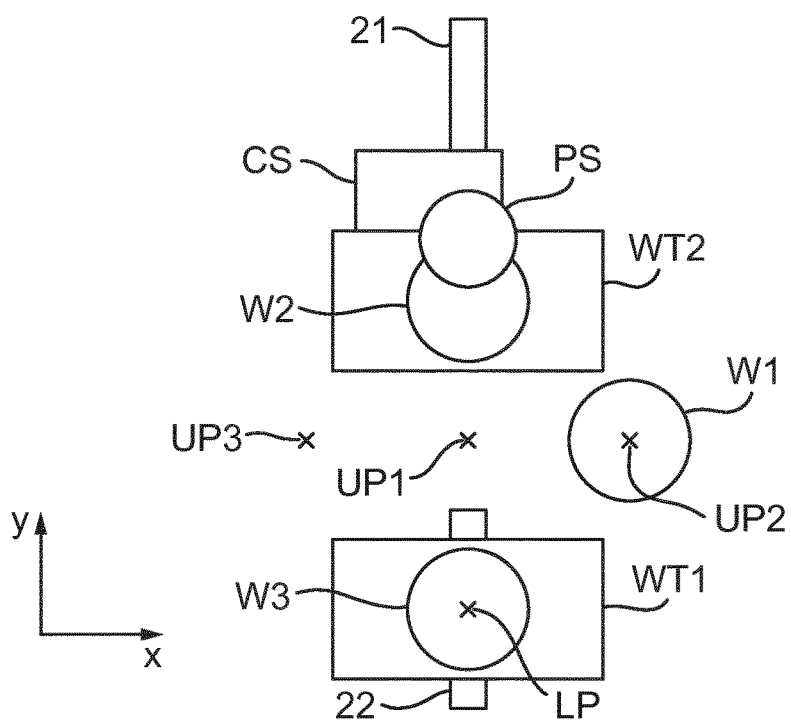

FIG. 10 depicts a time when the pre-exposure scrum sweep operation 47 is being performed by the calibration stage CS and the second substrate stage WT2, while the substrate exchange operation 41 is being performed at the first substrate stage WT1. As depicted in the transition from FIG. 9 to FIG. 10, the control system 500 is configured to move the second substrate stage WT2 and the calibration stage CS in the +Y direction. During this movement the contact or proximity of the calibration stage CS with the second substrate stage WT2 is maintained. During this pre-exposure scrum sweep operation 47, the confined immersion liquid is moved from being above the calibration stage CS to being above the second substrate stage WT2.

The overlap time between the sensing and/or cleaning operation 45 and the substrate exchange operation 41 allows extra time for the substrate alignment and/or levelling operation 44 for a given exposure time (because the substrate alignment and/or levelling operation 44 occurs at the same time as the exposure operation 43 for another substrate). Accordingly, image quality (e.g. overlay, focus etc.), yield (e.g. reducing the possibility of defects) and/or availability (i.e. uptime of the lithographic apparatus 100) can be improved without reducing throughput. This amount of time can be used in a variety of different ways. For example, if the time taken for an exposure operation 43 to be completed can be shortened, then the throughput can be increased without any reduction in image quality.

The control system 500 is configured to start the substrate exchange operation 41 by stopping clamping the first substrate W1 to the first substrate stage WT1 (e.g. by ending the suction that clamps the substrate W onto the first substrate stage WT1). The substrate exchange operation 41 is finished when the third substrate W3 is clamped to the first substrate stage WT1.

Figure 11:
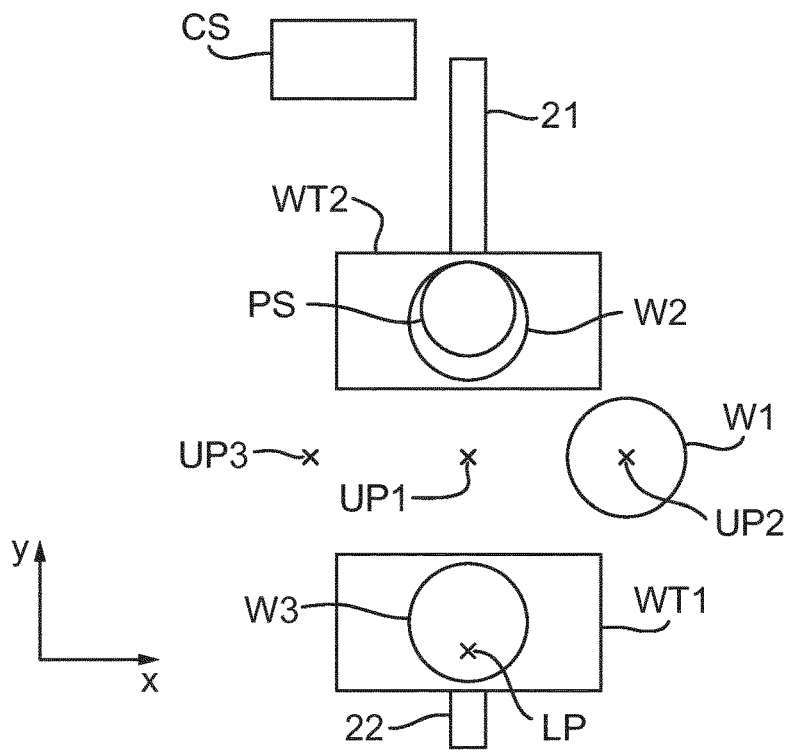

FIG. 24 is a diagram showing an operational sequence of a three-stage system for the lithographic apparatus 100 according to an alternative embodiment of the invention. In an embodiment the control system 500 is configured sequentially to load the third substrate W3 to the first substrate stage WT1, then move (or locate) the first substrate stage WT1 underneath or in the proximity of an alignment system and/or a levelling system, and then to start operating the alignment system and/or the levelling system. In an embodiment, at least one of the alignment system and levelling system is used when the first substrate stage WT1 is at the measurement station as shown in FIG. 11. In an embodiment the alignment system and/or levelling system are employed at the same time that the second substrate W2 is undergoing the exposure operation 43. As depicted in FIG. 24, in an embodiment the calibration stage CS is located underneath or in the proximity of the projection system PS at the moment the alignment system and/or the levelling system starts to be operated by the control system 500. This can be done if the time taken to perform the stage swapping operation 42 and the substrate exchange operation 41 is less than the time used for performing the sensing and/or cleaning operation 45 at the calibration stage CS. Accordingly, a longer time for performing the substrate alignment and/or levelling operation 44 can be provided so as to improve overall image quality. The alignment system may comprise multiple alignment sensors as disclosed in US patent application US 2009-0233234A1, hereby incorporated by reference. Alternatively, the alignment system may comprise a single alignment sensor. The substrate W may be moved relative to the single alignment sensor during the alignment operation so the substrate alignment marks P1, P2 face the single alignment sensor subsequently.

In an embodiment the control system 500 is configured to finish measuring the position of substrate alignment marks $P_1$, $P_2$ on the third substrate W3 on the first substrate stage WT1 and finish the substrate alignment and/or levelling operation 44 for the third substrate W3 on the first substrate stage WT1 by the moment that the images are formed on all target portions C of the second substrate W2 on the second substrate stage WT2 (i.e. by the moment that the exposure operation 43 is completed).

As depicted in FIG. 10, the third substrate W3 which has not undergone an exposure operation 43 is loaded onto the first substrate stage WT1. The third substrate W3 may be held by a substrate loader such as a loading arm (which may be of the same type as the substrate unloader 23, or may be the same component as the substrate unloader 23) to deliver the third substrate W3 to the vertical movement pin, which has been maintained in its protruding position from the unloading position UP1. The control system 500 withdraws the substrate loader and moves the vertical movement pin downwards such that the third substrate W3 is supported by the supporting surface of the first substrate stage WT1.

In an embodiment the control system 500 is configured to move the first substrate stage WT1 to the loading position LP and/or load the third substrate W3 onto the first substrate stage WT1 at the same time as the sensing and/or cleaning operation 45 continues at the calibration stage CS. Once the sensing and/or cleaning operation 45 has been finished at the calibration stage CS, the control system 500 performs the pre-exposure scrum sweep operation 47 such that the second substrate stage WT2 is under the confined immersion liquid and so that an exposure operation 43 can be performed on the second substrate W2.

FIG. 11 depicts the situation in which an exposure operation 43 is being performed on the second substrate W2. At the same time as the exposure operation 43 is being performed on the second substrate W2, a substrate alignment and/or levelling operation 44 can be performed on the third substrate W3 at a measurement station. In an embodiment, a substrate alignment sensor system, a levelling sensor system, and encoder heads on the second measurement arm 22 are located at the measurement station. The substrate alignment sensor system and the levelling sensor system can measure the third substrate W3 and/or the first substrate stage WT1. In an embodiment, by the time the exposure operation 43 on the second substrate W2 has been completed, the alignment and/or levelling operation 44 for the third substrate W3 has already been completed. In particular, extra time is saved by starting the substrate exchange operation 41 while the sensing and/or cleaning operation 45 is still being performed at the calibration stage CS. The extra time can be used to start and complete the alignment and/or levelling operation 44 earlier.

Figure 12:
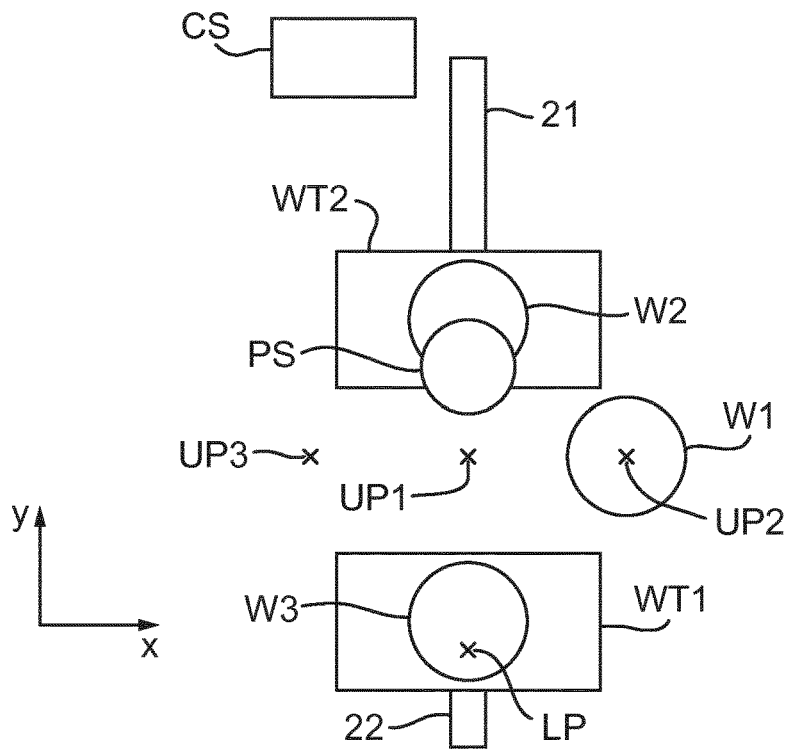

FIG. 12 depicts the situation in which an exposure operation 43 is continuing on the second substrate W2. The alignment and/or levelling operation 44 performed on the third substrate W3 have been completed. The control system 500 is configured to move the first substrate stage WT1 in the +Y direction and the −X direction from the loading position LP to the second waiting position UP3, as shown in the transition from FIG. 12 to FIG. 13. At the same time the control system 500 is configured to control the calibration stage CS to be at a position distanced from the second substrate stage WT2 so as not to interfere with the exposure operation 43 on the second substrate W2.

Figure 13:
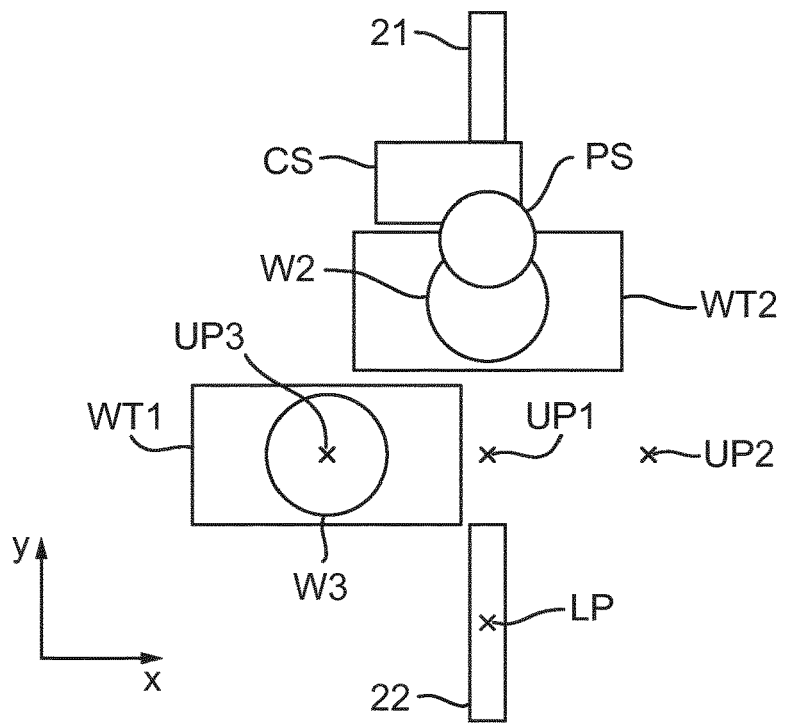

As shown in the transition from FIG. 12 to FIG. 13, the control system 500 is configured to perform a substrate exit operation 46 to remove the first substrate W1 from the first waiting position UP2 to outside of the lithographic apparatus 100. The control system 500 is configured to move the calibration stage CS back to a position where the calibration stage CS is in contact or in proximity with the second substrate stage WT2 in readiness for the post-exposure scrum sweep operation 48. In the post-exposure scrum sweep operation 48, the calibration stage CS and the second substrate stage WT2 are moved such that the confined immersion liquid is transferred from substrate stage WT2 to the calibration stage CS.

Figure 14:
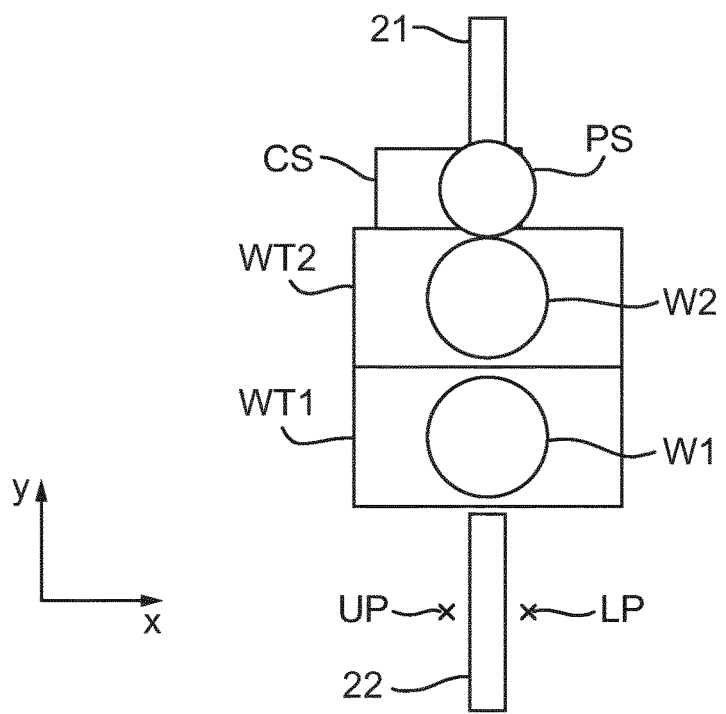
FIGS. 14 to 16 schematically depict, in plan, a lithographic apparatus 100 using a three-stage system at various times during operation according to an alternative embodiment.
Figure 15:
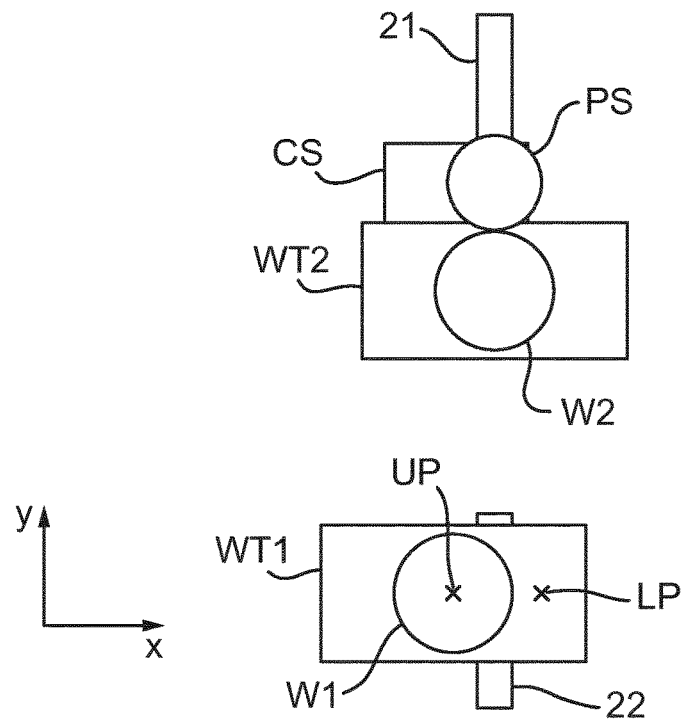
Figure 16:
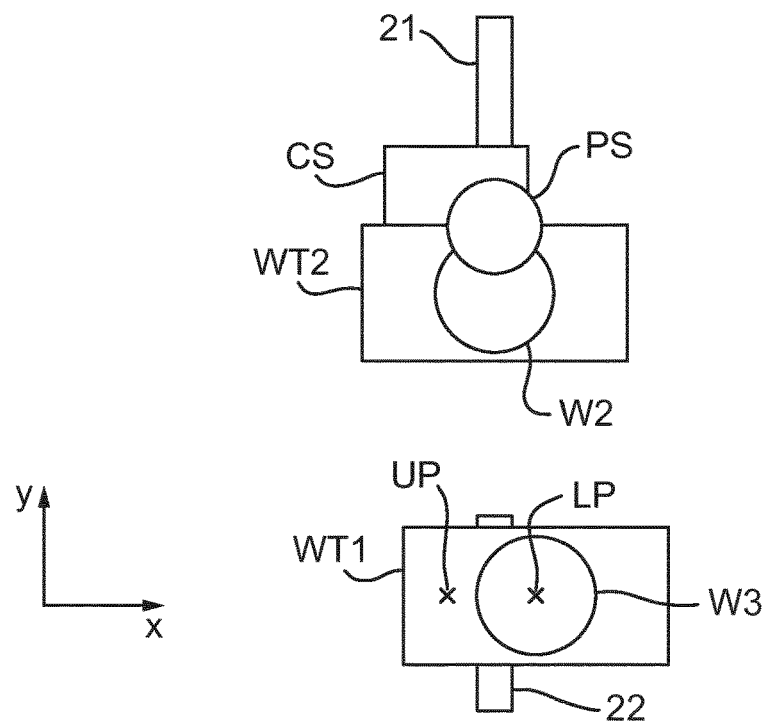

FIGS. 14 to 16 depict a modified embodiment comprising a simpler procedure for performing the substrate exchange operation 41. As shown in FIG. 14, in an embodiment the lithographic apparatus 100 comprises an unloading position UP and a loading position LP at either side of the second measurement arm 22. As shown in the transition from FIG. 14 to FIG. 15 and then to FIG. 16, during the pre-exposure scrum sweep operation 47 from the calibration stage CS to the second substrate stage WT2, the control system 500 is configured to perform a substrate exchange operation 41 to unload the first substrate W1 from the first substrate stage WT1 and then load the third substrate W3 onto the first substrate stage WT1.

FIG. 15 depicts a moment when the sensing and/or cleaning operation 45 is being performed at the calibration stage CS at the same time as the substrate exchange operation 41 is being performed at the first substrate stage WT1. Only the calibration stage CS is located at the projection system PS. The second substrate stage WT2 is not yet involved in the pre-exposure scrum sweep operation 47 with the calibration stage CS.

FIG. 16 depicts a time when the pre-exposure scrum sweep operation 47 is being performed by the calibration stage CS and the second substrate stage WT2, while the substrate exchange operation 41 is being performed at the first substrate stage WT1.

In an embodiment the control system 500 is configured to move the first substrate stage WT1 to the unloading position UP at which the first substrate W1 is unloaded from the first substrate stage WT1. After the first substrate W1 has been unloaded from the first substrate stage WT1, the control system 500 is configured to move the first substrate stage WT1 from the unloading position UP to the loading position LP. When the first substrate stage WT1 is at the loading position LP, the control system 500 is configured to load the third substrate W3 onto the first substrate stage WT1 (e.g. by using a substrate loader). In an embodiment the substrate exit operation 46 is performed at the same time as (i.e. as part of) the substrate exchange operation 41. In an embodiment the time period that is assigned to the substrate exit operation 46 in FIG. 23 is re-assigned to a waiting operation. In the waiting operation, the control system 500 is configured to maintain the second substrate stage WT2 at a standby position for a waiting time period, waiting for the stage swapping operation 42 to be started. In an embodiment the waiting time period is set to zero so that more time can be spent for the substrate alignment and/or leveling operation 44.

According to the invention, both the stage swapping operation 42 and the substrate exchange operation 41 are performed at least partly during the sensing and/or cleaning operation 45 performed at the calibration stage CS. Accordingly, throughput can be improved and/or image quality, yield and/or availability can be improved without decreasing throughput by allowing more time for sensing, cleaning, substrate alignment and/or levelling, for example.

Although in the embodiment described above, the third stage is a calibration stage CS, this is not necessarily the case. The third stage can be any stage that accommodates a component that includes at least one of a sensor and a cleaning device. When the component includes a sensor, the sensor may be arranged to measure at least one property of the exposure radiation provided by the projection system PS. In an embodiment the measured property includes dose and/or uniformity of the exposure radiation provided by the projection system PS.

In an embodiment the control system 500 is configured to swap the locations of the first substrate stage WT1 and the second substrate stage WT2 (as shown in FIG. 9, for example) before controlling the substrate unloader 23 to unload the first substrate W1 from the first substrate stage WT1 (shown in FIG. 10, for example). In an embodiment the calibration stage CS is located underneath or in the proximity of the projection system PS at the moment that the substrate unloader 23 starts to be operated (i.e. in between the situations shown in FIG. 9 and FIG. 10.

Although the present invention is equally applicable to a dry lithographic apparatus, in an embodiment the lithographic apparatus 100 comprises a liquid handling system IH configured to supply and confine immersion liquid to a space 11 defined between the projection system PS and a substrate W and/or between the projection system PS and one of the stages. In an embodiment the calibration stage CS accommodates a component that includes a cleaning device configured to clean the liquid handling system IH.

In an embodiment the calibration stage CS accommodates a component that includes a sensor that is a monitoring device configured to monitor the contamination level of the liquid handling system IH. In an embodiment the control system 500 is configured to initiate offline cleaning of the liquid handling system IH when it is determined that the contamination level is equal to or above an offline cleaning threshold level. In an embodiment the monitoring device configured to monitor the contamination level of the liquid handling system IH comprises a camera (or other optical device).

If it is determined that the liquid handling system IH is only slightly dirty, i.e. below the offline cleaning threshold level, then the control system 500 is configured to execute or schedule online cleaning of the liquid handling system IH. For example, an online cleaning operation may be performed between each exposure operation 43, or may be scheduled to be performed at regular time intervals, for example. On the other hand, if it is determined that the liquid handling system IH is very dirty, i.e. that the contamination level is equal to or above the offline cleaning threshold level, then the control system 500 is configured to schedule an offline cleaning operation.

In an embodiment, an online cleaning operation is performed using a cleaning device on the calibration stage CS, for example an ultrasonic cleaner. An offline cleaning operation may be performed using a liquid cleaner and a dummy substrate, for example. These are explained in further detail below.

Figure 21:
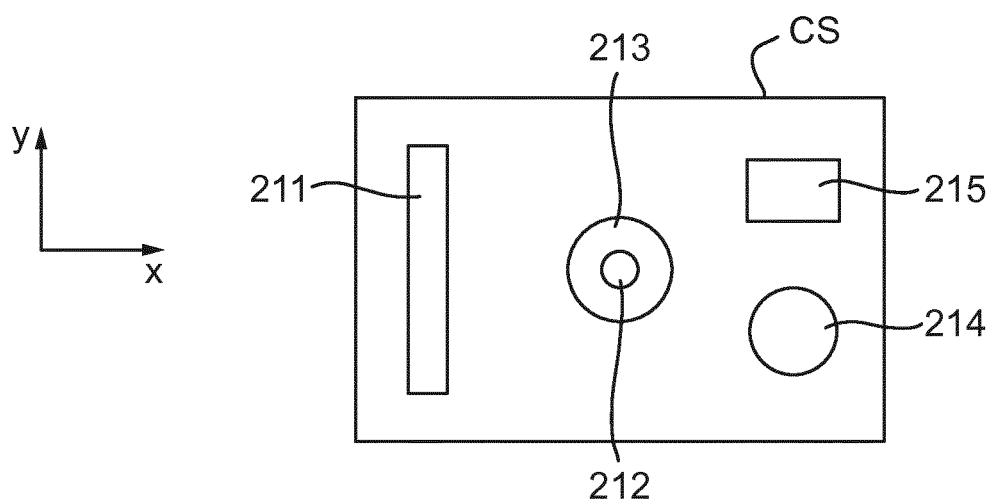
FIG. 21 schematically depicts, in plan, an example of a calibration stage for use in a lithographic apparatus 100 according to an embodiment of the invention.

FIG. 21 schematically depicts, in plan, an example of the calibration stage CS according to an embodiment of the invention. In an embodiment, a vibration member 213 is provided on the calibration stage CS. In an embodiment the vibration 213 is arranged in a recess of the calibration stage CS. The recess is formed in the upper surface of the calibration stage CS. The vibration member 213 opposes the final element of the projection system PS when the calibration stage CS is under the projection system PS.

In an embodiment a clearance gap is formed between the outer edge of the vibration member 213 and the surrounding upper surface of the calibration stage CS so as to allow space for the vibration member 213 to vibrate. The gap may be, for example, about 0.1 mm.

As depicted in FIG. 21, in an embodiment an ultrasonic wave generator 212 is provided to vibrate the vibration member 213. The ultrasonic wave generator 212 is fixedly attached to the vibration member 213. When the ultrasonic wave generator 212 generates an ultrasonic wave, the vibration member 212 vibrates. The ultra sonic wave generator 212 is connected to the vibration member 213 at the inside of the recess in the calibration stage CS. In an embodiment the upper surface of the vibration member 213 is substantially flush with the upper surface of the calibration stage CS.

FIG. 21 further shows measuring devices 214 and 215, which may be sensors provided at the calibration stage as described above. FIG. 21 also shows a measuring member 211, which may be a further sensor as described above.

During an online cleaning operation, the control system 500 is configured to vibrate the vibration member 213 by the ultrasonic wave generator 212 connected to the vibration member 213. As a result the ultrasonic wave is applied to liquid that is in contact with the upper surface of the calibration stage CS, i.e. liquid confined by the liquid handling system IH. The supply and recovery of the liquid are continued during the online cleaning operation. Alternatively, the supply and recovery of the liquid may be stopped temporarily or intermittently during the online cleaning operation.

In an embodiment the control system 500 is configured to move the calibration stage CS with respect to the projection system PS during the online cleaning operation. This allows the final element of the projection system PS to be cleaned or washed uniformly and reliably regardless of the difference in size between the vibration member 213 and the space 11 in which the liquid is confined by the liquid handling system IH. In an embodiment the control system 500 is configured to stop the vibration of the vibration member 213 during movement of the calibration stage CS. In an embodiment the control system 500 is configured to vibrate the vibration member 213 only when the calibration stage CS is stopped at a predetermined position relative to the projection system PS. In an embodiment, the calibration stage CS is moved with respect to the liquid handling system IH during the cleaning operation to clean a bottom surface of the liquid handling system IH. For example, the porous member 33 and/or the fluid recovery part 197 are cleaned during the cleaning operation.

In an embodiment the control system 500 is configured to control the liquid handling system IH to confine a different liquid from the immersion liquid during the online cleaning operation. Accordingly, a cleaning liquid rather than the immersion liquid can be used to perform cleaning during the online cleaning operation. Alternatively, in an embodiment the same type of immersion liquid as used during an exposure operation 43 is confined in the space 11 during the online cleaning operation.

In an embodiment the offline cleaning operation can be performed by positioning a dummy substrate below the projection system PS. During the offline cleaning operation, liquid-based cleaning can be performed. The type of offline cleaning operation is not particularly limited. In an embodiment the offline cleaning operation comprises liquid-based cleaning using a dummy substrate. An example of this type of offline cleaning operation that can be used in the context of the invention is disclosed in WO 2010-018825 A1. In an embodiment the liquid-based cleaning comprises water cleaning using regular immersion liquid (i.e. the same type of immersion liquid as used during the exposure operation 43). In an alternative embodiment the liquid-based cleaning operation comprises chemical cleaning using a cleaning liquid. In an alternative embodiment the liquid-based cleaning operation comprises reverse-flow cleaning. In reverse-flow cleaning, the direction of flow of liquid through the liquid handling system IH is reversed. The control system 500 is configured to reverse the flow of liquid through the liquid handling system IH during the offline cleaning operation. An example of reverse-flow cleaning that can be used in the context of the invention is disclosed in Japanese patent application publication No. JP 2012-109359 A, hereby incorporated by reference.

In an alternative embodiment, the offline cleaning operation comprises using a dedicated cleaning device. For example, in an embodiment the cleaning device comprises a brush, an ionized-gas supplier and a gas extractor. An example of a cleaning device that can be used during an offline cleaning operation in the context of the invention is disclosed in Japanese patent application publication No. JP 2013-187465 A, hereby incorporated by reference.

In an embodiment the control system 500 is configured to use a lens heating model in order to simulate thermal aberrations of the projection system PS. In an embodiment the control system 500 is configured to calibrate the lens heating model using actual measurement data obtained by an aberration sensor on the calibration stage CS. In an embodiment the control system 500 is provided with software for heat aberration control. For the first batch of substrates, a high speed phase measurement interferometer may be used for interval calibration in order to reduce imaging errors caused by heat aberrations. After the first batch of substrates, the feedforward control can be used to reduce the effect of the thermal aberrations using the lens heating model. For the first batch of substrates, the time period allowed for the exposure operation 43 can be increased while performing the interval calibration (a form of on-product learning). After the first batch of substrates, the throughput can be increased by decreasing the time allowed for the exposure operation 43 and using the lens heating model to simulate the thermal aberrations.

In an embodiment the control system 500 is configured to compensate for a lens heating effect (e.g. aberration or distortion induced by a heated lens element in the projection system PS), for example as described in WO 2006-025408 A1. In an embodiment, the control system 500 is configured to compensate for a patterning device heating effect (e.g. aberration or distortion induced by a heated patterning device MA), for example as described in Japanese patent application publication No's. JP 2011-060882 A and JP 2012-079735 A, both are hereby incorporated by reference.

Figure 19:
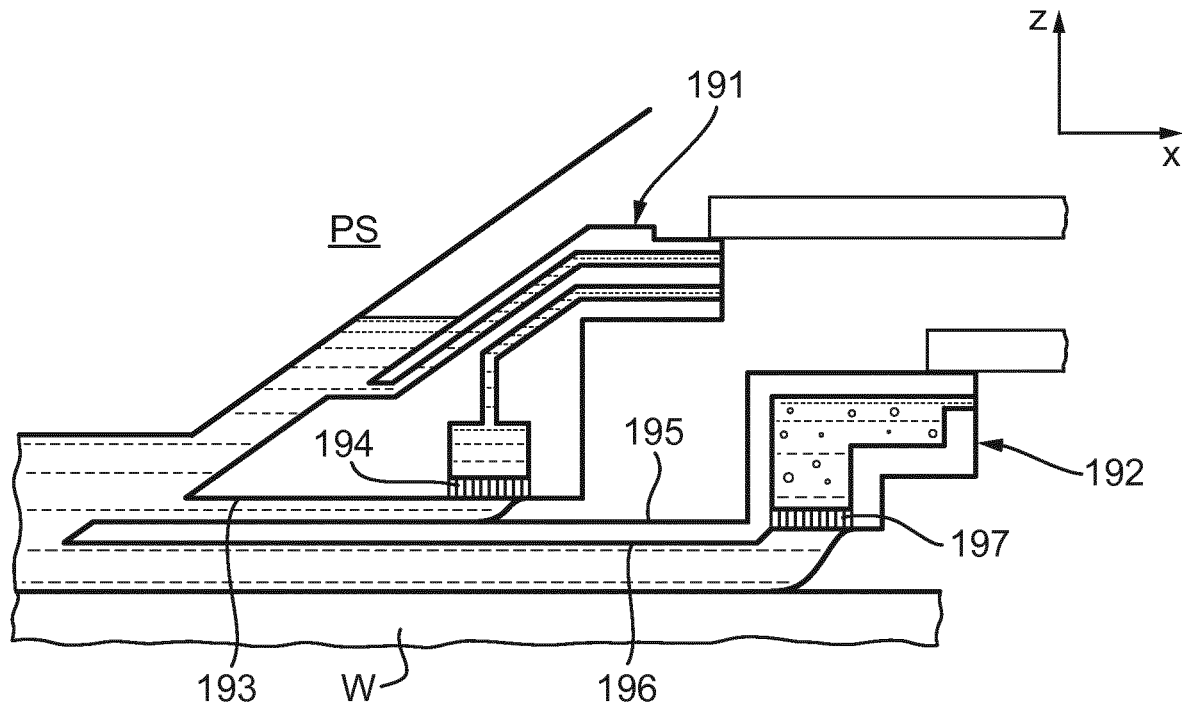
FIG. 19 schematically depicts a side cross-section view of part of a further liquid handling system for use in a lithographic apparatus 100 according to an embodiment of the invention.

FIG. 19 depicts in cross section part of a liquid handling system IH for use in a lithographic apparatus 100 according to an embodiment of the invention. As shown in FIG. 19, in an embodiment the liquid handling system IH comprises an actuatable flow plate 192. The actuatable flow plate 192 is configured to be independently position-controlled with respect to the projection system PS and with respect to the stages (i.e. the first substrate stage WT1, the second substrate stage WT2 and the calibration stage CS). In an embodiment the control system 500 is configured to control the position of the actuatable flow plate 192. In an embodiment the control system 500 is configured to control the position of the actuatable flow plate 192 as a function of relative position, velocity and/or acceleration of one of the stages with respect to the projection system PS.

As depicted in FIG. 19, in an embodiment the liquid handling system IH comprises a stationary upper part 191 generally above the actuatable flow plate 192. The stationary upper part 191 is disposed near the final element of the projection system PS. The actuatable flow plate 192 is disposed surrounding the optical path of the radiation beam B below the stationary upper part 191. The actuatable flow plate 192 is configured to be able to move relative to the stationary upper part 191.

As shown in FIG. 19, in an embodiment the stationary upper part 191 comprises a lower surface 193 facing the −Z axis direction and a liquid recovery part 194 configured to recover the immersion liquid from the space 11. In an embodiment the actuatable flow plate 192 comprises an upper surface 195 facing the +Z axis direction, a lower surface 196 facing the −Z axis direction, and a fluid recovery part 197. The fluid recovery part 197 may be a two-phase extractor configured to remove both liquid and gas from the space 11 in which the immersion liquid is confined.

In an embodiment the actuatable flow plate 192 is configured to move in the XY-plane such that the size of the radial gap between the stationary upper part 191 and the actuatable plate 192 shown in the middle of FIG. 19 is changed. In an embodiment the range of movement of the actuatable flow plate 192 is determined so that the stationary upper part 191 and the actuatable flow plate 192 do not contact each other in use of the lithographic apparatus 100.

In an embodiment the control system 500 is configured to move the actuatable flow plate 192 in parallel with at least a part of a period in which the exposure radiation is provided by the projection system PS. In an embodiment the actuatable flow plate 192 moves in a state where the liquid immersion space 11 is formed. The movement of the actuatable flow plate 192 enables a reduction in the relative speed and/or acceleration of the actuatable flow plate 192 of the liquid handling system IH with respect to the substrate W. This is expected to improve stability of the meniscus at the sides of the space 11 in which the immersion liquid is confined without slowing down the motion of the substrate stage WT.

The present invention is applicable either to an immersion lithographic apparatus or to a dry lithographic apparatus (e.g. a dry DUV scanner). In the description above, the pre-exposure scrum sweep operation 47 and the post-exposure scrum sweep operation 48 have been described in the context of an immersion lithographic apparatus in relation to the stage under the immersion liquid changing.

The pre-exposure scrum sweep operation 47 involves the calibration stage CS and one of the substrate stages (e.g. the second substrate stage WT2) moving such that the second substrate stage WT2 is below the projection system PS. In an embodiment the pre-exposure scrum sweep operation 47 is performed for a dry lithographic apparatus. In an embodiment, the control system 500 is configured to perform patterning device alignment during the pre-exposure scrum sweep operation 47 for either an immersion lithographic apparatus or a dry lithographic apparatus. The method for performing the patterning device alignment is not particularly limited. An example of a suitable method for performing patterning device alignment is described below.

Figure 25:
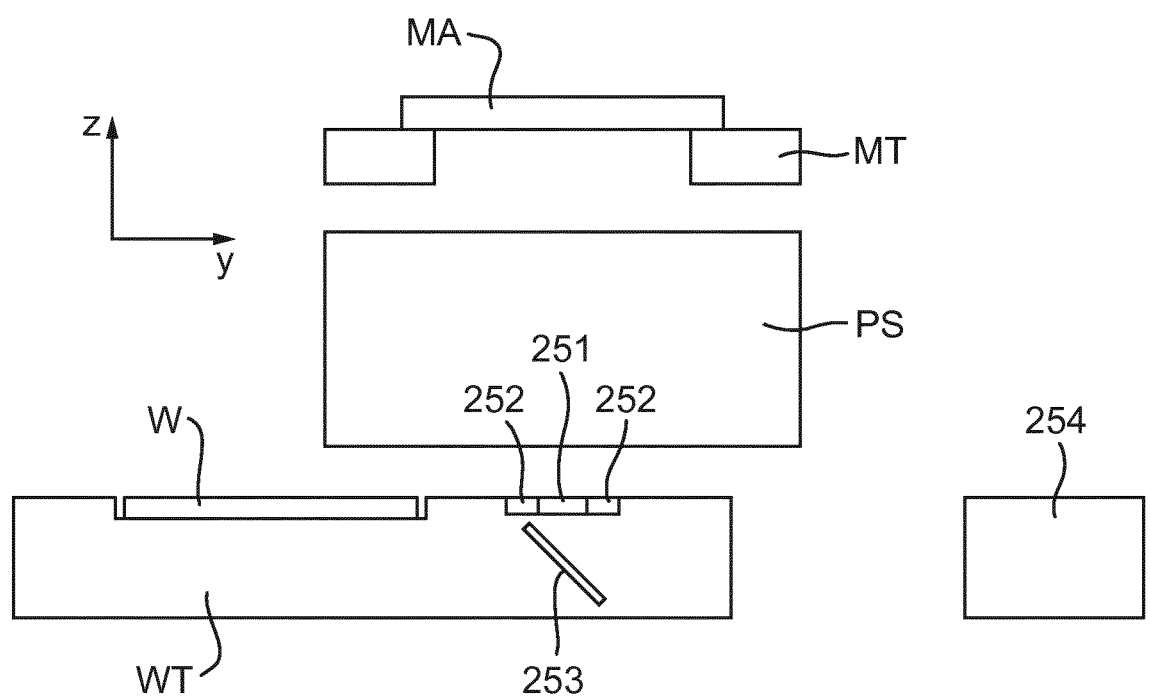
FIG. 25 schematically depicts a patterning device alignment system for use in a lithographic apparatus 100 according to an embodiment of the invention.

FIG. 25 schematically depicts a patterning device alignment system for use in a lithographic apparatus 100 according to an embodiment of the invention. As mentioned above, in an embodiment the calibration stage CS accommodates a component that includes an aerial image sensor 254. As depicted in FIG. 25, in an embodiment the substrate stage WT comprises a fiducial mark 251. The fiducial mark 251 is for patterning device alignment on the substrate level. The fiducial mark 251 is located on the substrate stage WT. The fiducial mark 251 is at the top surface of the substrate stage WT so that it is visible from above.

In an embodiment a mirror 253 is provided inside the substrate stage WT. In use, a radiation beam having an aerial image of the patterning device MA is reflected by the mirror 253 to the aerial image sensor 254. In an embodiment the aerial image sensor 254 is attached to the side surface of the calibration stage CS. In an embodiment the detection of the aerial image of the patterning device MA is performed during the pre-exposure scrum sweep operation 47. During the pre-exposure scrum sweep operation 47, the distance between the substrate stage WT and the calibration stage CS is fixed. Accordingly, the distances between the fiducial mark 251, the mirror 253 and the aerial image sensor 254 are fixed. Hence, the duration of the pre-exposure scrum sweep operation 47 is an appropriate time for the aerial image to be detected. In an embodiment the aerial image is detected at the moment that the fiducial mark 251 on the substrate stage WT is located at the optical axis of the projection system PS.

In an embodiment the fiducial mark 251 is formed on a centerline of the substrate stage WT. As depicted in FIG. 25, in an embodiment a pair of aerial image measurement slit patterns 252 are symmetrically positioned with respect to the center of the fiducial mark 251. In an embodiment each aerial image measurement slit pattern 252 comprises an L-shaped slit pattern, or two linear slit patterns extending in the X-axis and Y-axis directions respectively can be used.

The post-exposure scrum sweep operation 48 involves the calibration stage CS and one of the substrate stages (e.g. the first substrate stage WT1) moving such that the calibration stage CS is positioned below the projection system PS. In an embodiment, the post-exposure scrum sweep operation 48 is not performed for a dry lithographic apparatus. This means that at this point in the operation of the dry lithographic apparatus, it is not necessary for the calibration stage CS and the first substrate stage WT1 to be in contact or proximity with each other. In an alternative embodiment, the post-exposure scrum sweep operation 48 is performed for a dry lithographic apparatus.

As explained above, in an embodiment the lithographic apparatus 100 comprises an illumination system IL configured to condition a radiation beam B. In an embodiment the illumination system IL comprises a sensor configured to measure distribution of an illumination pupil of the illumination system IL. In an alternative embodiment the calibration stage CS accommodates a component that includes the sensor configured to measure distribution of the illumination pupil.

In an embodiment the illumination system IL comprises a spatial light modulator 206 that comprises a plurality of individually controllable optical elements arranged two-dimensionally. In an embodiment the control system 500 is configured to use data of the measured property of the exposure radiation to monitor or to calibrate how the illumination system IL conditions the radiation beam B. In an embodiment the control system 500 is configured to adjust or control the spatial light modulator based on the data of the measured property of the exposure radiation. In an alternative embodiment the control system 500 is configured to adjust or control the spatial light modulator based on data from a simulation model. In an embodiment, the control system 500 is configured to use the measured uniformity of the exposure radiation or the measured distribution of the illumination pupil to calibrate, update or improve the simulation model. An example of a simulation model that can be used in the context of the invention is disclosed in Japanese patent application publication No. JP 2012-099685 A, hereby incorporated by reference.

Figure 20:
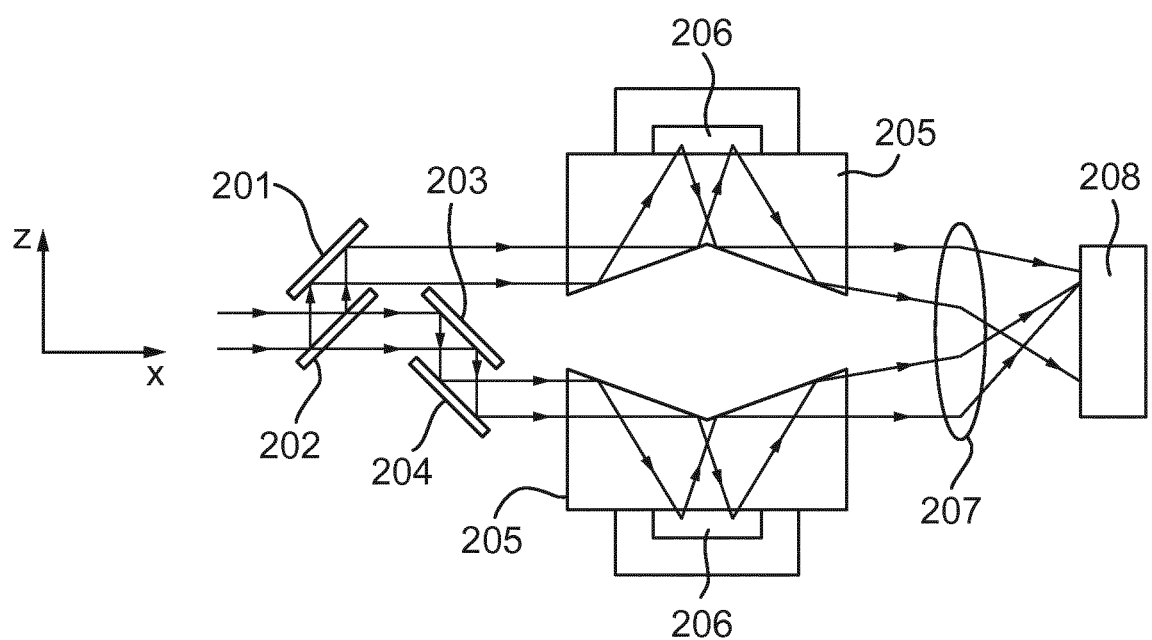
FIG. 20 schematically depicts an example of a spatial light modulator of an illumination system for use in a lithographic apparatus 100 according to an embodiment of the invention.

Merely as an example, FIG. 20 schematically depicts a spatial light modulator 206 that could be used in conjunction with the present invention. FIG. 20 shows inclination angles of some of a plurality of mirror elements in two spatial light modulators 206 in quadrupolar illumination. The spatial light modulator 206 comprises a large number of mirror elements.

As depicted in FIG. 20 the illumination system IL comprises a polarisation beam splitter 202 which splits the illumination light into two illumination beams having different polarisations. A mirror 201 reflects one of the illumination beams into the +Y direction and two further mirrors 203, 204 shift the other illumination beam into the -Z direction and then reflect it into the +Y direction. The illumination beams then travel via prisms 205 into one of the spatial light modulators 206, back through the prisms 205, through a relay optical system 207 to impinge on a surface of an optical integrator 208. In an embodiment the optical integrator 208 is a rectangular shape of approximately similar size as the illumination region on the surface of the patterning device MA. The spatial modulation devices 206 at least in part combine the two beams having different polarisations. In an embodiment the control system 500 is configured to adjust or condition the spatial light modulation devices 206 based on data output by at least one sensor on the calibration stage CS.

Figure 17:
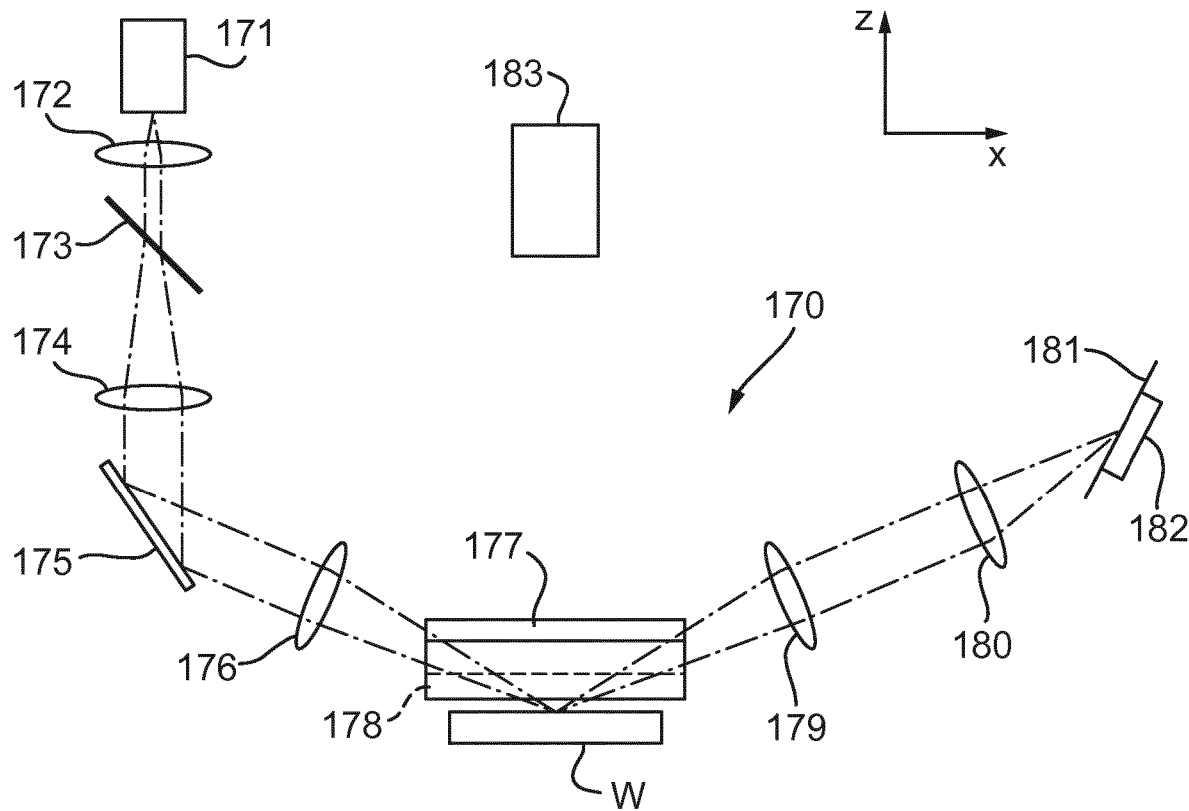
FIG. 17 schematically depicts an example of a levelling system device for use in a lithographic apparatus 100 according to an embodiment of the invention.

As explained above, in an embodiment a substrate alignment and/or levelling operation 44 is performed on a substrate W that is to undergo an exposure operation 43. FIG. 17 depicts an example of a levelling system that can be used in conjunction with the present invention. Other levelling systems can also be used.

The levelling system shown in FIG. 17 may be called an auto focus system and may be a slit type system. The levelling system comprises a light source assembly. The light source assembly is configured to illuminate a substrate W with a measurement beam. The light source assembly comprises a broadband light source 171 that generates light, a lens 172 that collimates the light from the broadband light source 171, a slit mask 173 that shapes the slits of light, a lens 174 that collimates the light from the slit mask 173, a vibrating mirror assembly 175 that causes the slits of light to move back and forth on the substrate W and the redirectors 177, 178, and a lens 176 that focuses the slits of light onto the substrate W and the redirectors 177, 178. The levelling system may comprise a single set of the auto focus system. Alternatively, the levelling system may comprise multiple sets of the auto focus system as disclosed in Japanese patent application publication No. JP 2013-236074A.

In an embodiment a first portion (or measurement beam) of the slits of light is imaged onto the substrate W. A second portion (or reference beam) is projected onto the redirectors 177, 178. In FIG. 17 the slits of light that are furthest out of the page along the Y axis is the reference light, whilst the slits of light that are into the page along the Y axis is the measurement light. The redirectors 177, 178 pick off and redirect the reference beam before it is imaged onto the substrate W.

The measurement beam is projected onto the substrate W at a glancing angle of incidence. The reference beam is projected onto the redirectors 177, 178 at a glancing angle of incidence. Subsequently, the measurement beam reflected by the substrate W and the reference beam is reflected by the redirectors 177, 178 and both are re-imaged onto the detector assembly. In an embodiment the detector assembly comprises a lens system 179, 180 that images the light reflected from the substrate W onto a slit mask 181, and a detector 182 (e.g. CCD). The light that passes through the slit mask 181 is subsequently measured by the detector 182. As a result, the same detector 182 is used to measure both the measurement beam that is reflected by the substrate W and the reference beam reflected by the redirectors 177, 178. Accordingly, the detector 182 can provide to the controller 183 of the levelling system both a measurement signal that relates to the measurement beam reflected by the substrate W and a reference beam that relates to the reference light reflected by the redirectors 177, 178.

The reference signal relates to the measurement of everything that changes the focus except for the position of the substrate W, and the measurement signal relates to the measurement of everything changing the focus including the position of the substrate W. Accordingly, the controller 183 can subtract the reference signal from the measurement signal to determine the position of the substrate W. As a result, the instability in the system components and/or environmental factors that could otherwise cause erroneous information to be produced at the detector 182 can be compensated for. The controller 183 can determine the height of the substrate W, and can thus determine the overall flatness of the substrate W.

Figure 18:
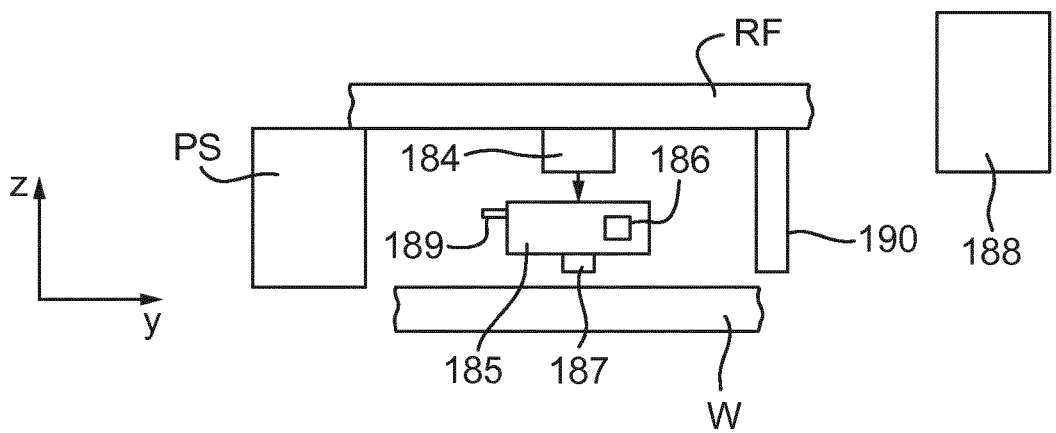
FIG. 18 schematically depicts another example of a levelling system device for use in a lithographic apparatus 100 according to an embodiment of the invention.

FIG. 18 schematically depicts an alternative levelling system. In an embodiment the levelling system is an air gap sensor system that comprises at least one proximity sensor. The air gap sensor system can be used to measure the height (position in the Z-direction) of a substrate W relative to the final element of the projection system PS. In an embodiment the air gap sensor system comprises a frame, which may be the same as the main frame RF or a different metrology frame. The frame serves as a positional reference in the height direction. In an embodiment the air gap sensor system comprises an air gauge 185 as an exemplary analogue proximity sensor. An actuator 184 and a height encoder 190 are mounted to the main frame RF. The air gauge 185 is coupled to the actuator 184. The height encoder 190 measures the height of the air gauge 185.

In an embodiment the actuator 184 comprises a piezoelectric actuator or a voice-coil motor. The actuator 184 is configured to move the air gauge 185 relative to the main frame RF toward the substrate W to a "use" position whenever the air gauge 185 is to be used for measuring the height of the substrate W. The actuator 185 is configured to move the air gauge 185 away from the substrate W when it is not being used for measuring the substrate height. During these motions the height encoder 190 is configured to measure the height of the air gauge 185 relative to the main frame RF. In an embodiment the air gauge 185 comprises a probe 187, an inlet 189 for supplying pressurised air, and a differential pressure sensor 186. Other configurations of the air gauge 185 are also compatible with the present invention. By using the air gauge 185 to measure the height of different portions of the upper surface of the substrate W, the flatness of the substrate W can be measured.

Figure 26A:
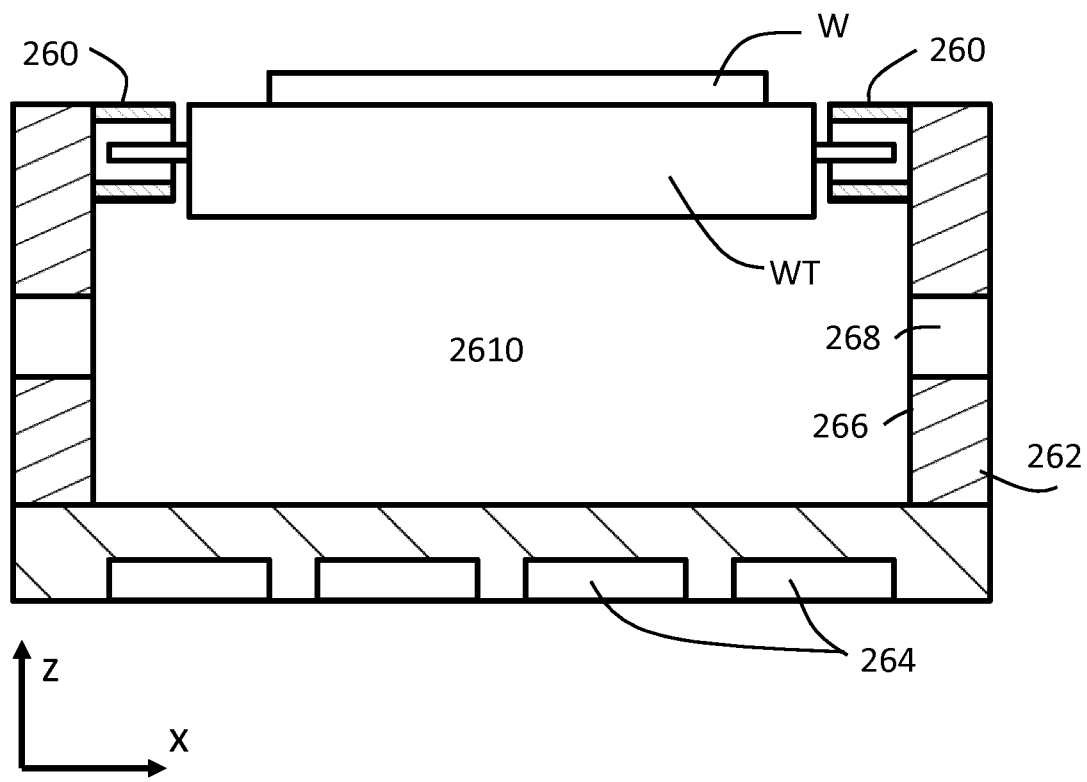
FIGS. 26A and 26B show respectively a front view and a side view of a substrate stage WT1 according to an embodiment of the invention.
Figure 26B:
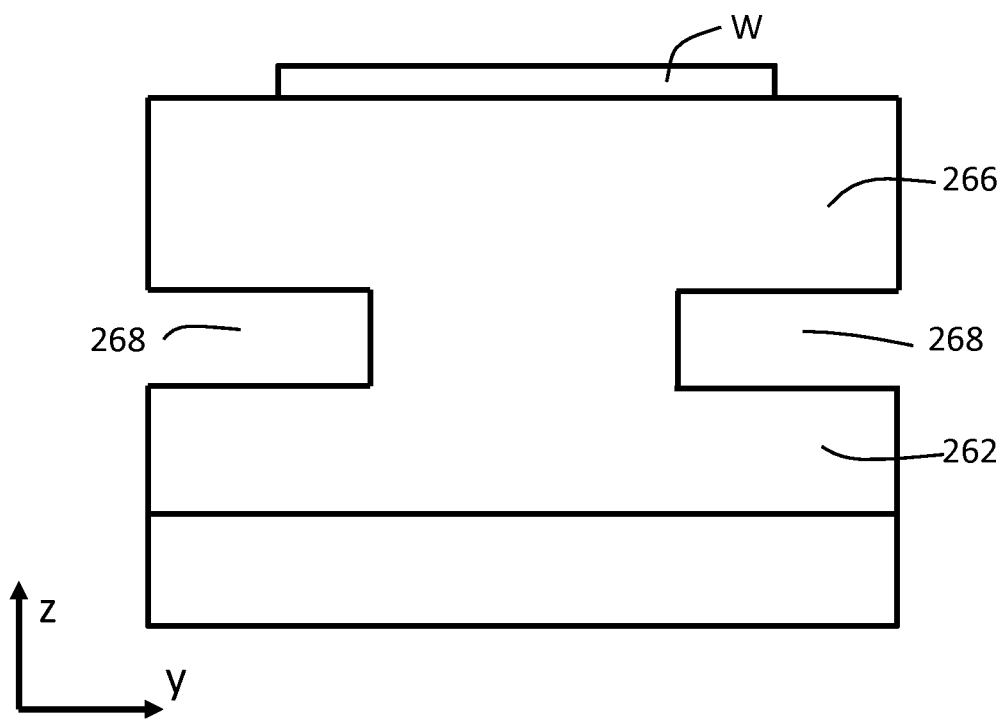

FIGS. 26A and 26B show respectively a front view and a side view of a substrate stage WT1 according to an embodiment of the invention. The substrate stage WT1 comprises a support table WT and a long-stroke module 262. The support table WT is arranged to support the substrate W. The support table WT can be moved relative to the long-stroke module 262 via an actuator 260. The long-stroke module 262 is provided with a plurality of magnets 264, which form part of a planar motor. The actuator 260 and the magnets 264 are connected to each other via walls 266.

The planar motor is arranged to move the long-stroke module 262 relative to the projection system PS in the xy-plane. The range of the planar motor may be large enough to perform the stage swapping operation 42 as described above. The actuator 260 may move the support table WT relative to the long-stroke module 262 over a smaller range with high accuracy. For example, the range may be sufficiently large to move the support table WT over the length of a die. The actuator 260 may move the support table WT in the y-direction, i.e., the scan-direction. In addition, the actuator 260 may move the support table WT in the x-direction and/or in the z-direction and/or rotate the support table WT around the x-, y- and/or z-direction.

The planar motor, the walls 266 and the support table WT may define a space 2610. The space 2610 provides a volume in which the first measurement arm 21 may be, such that the first measurement arm 21 may cooperate with an encoder scale attached to the bottom of the support table WT (not shown).

When performing the stage swapping operation 42, as for example shown in FIGS. 9 and 14, the first substrate stage WT1 needs to move around the measurement arm 21 to prevent a collision of the long-stroke module 262 with the measurement arm 21. As shown in FIG. 9, the distance between the first measurement arm 21 and the second measurement arm 22 needs to be at least the length of the substrate stage WT1 plus the length of the substrate stage WT2.

However, the distance can be shortened by providing an opening 268 in the wall 266, as shown in FIGS. 26A, 26B. The opening 268 is large enough so part of the first measurement arm 21 fits through when the substrate stage WT1 moves in the x-direction. A shorter distance reduces the travel distance of the substrate stage WT1 and may thus increase productivity by increasing throughput and/or by reducing overhead time. The shorter distance may also result in a smaller lithographic apparatus, which may save valuable cleanroom space.

In the embodiment of FIGS. 26A, 26B, each of the two walls 266 is provided with two openings 268. Having these four openings 268 allows the most freedom for moving the first substrate stage WT1. The two openings 268 on the −y-side may cooperate with the second measurement arm 22, and the two openings 268 on the +y-side may cooperate with the first measurement arm 21. The first substrate stage WT1 may approach the first measurement arm 21 or the second measurement arm 22 from either the −x-direction and the +x-direction. In an embodiment, each of the walls 266 has only one opening 268. Only one wall 266 may have one or two openings 268. Having fewer openings 268 may limit the freedom of movement of the first substrate stage WT1, but may increase the stiffness of the first substrate stage WT1.

The opening 268 may be applied to the first substrate stage WT1, the second substrate stage WT2 and/or the calibration stage CS.

Many of the examples above have been described in the context of an immersion lithographic apparatus. However, the invention is equally applicable to a dry lithographic apparatus. As will be appreciated, any of the above-described features can be used with any other feature and it is not only those combinations explicitly described which are covered in this application.

As will be appreciated, any of the above described features can be used with any other feature and it is not only those combinations explicitly described which are covered in this application. For example, an embodiment of the invention could be applied with the liquid handling system shown in FIG. 4 and/or a substrate stage comprising a linear motor or multiple sets of linear motors. Furthermore, although embodiments of the invention have been described above in the context of an immersion lithographic apparatus for convenience, it will be appreciated that an embodiment of the invention may be used in conjunction with any form of lithographic apparatus. For example, the lithographic apparatus 100 may be an optical lithographic apparatus, an electron-beam lithographic apparatus or an imprint-type lithographic apparatus. The invention described above may be implemented in an imprint-type lithographic apparatus, comprising an imprint system 271 (instead of the projection system PS).

FIG. 27 schematically depicts an imprint system 271 according to an embodiment of the invention. The imprint-type lithography apparatus (further also referred to as the imprint apparatus) is a type of lithography apparatus and is used for the manufacturing process of a semiconductor device or the like, and molds an imprint material on a substrate W using a patterning device 276 to form a pattern on the substrate W. For example, the patterning device 276 is a mold, a template or a stamp in the imprint system 271. The imprint system 271 may use a resin 2711 as the imprint material and may adopt, as a curing method of the resin, a photo-curing method of curing the resin by irradiation with ultraviolet light (UV light) 2710. The UV light 2710 may be provided by a mercury lamp, an LED or a set of multiple LEDs. An imprint apparatus may be very similar to the lithography apparatus 100 described above. A difference is that the imprint apparatus imprints the pattern from the patterning device 276 into the resin 2711, whereas the lithography apparatus 100 projects an image of the pattern on the substrate W. Other parts of the imprint apparatus, such as the first substrate stage WT1, the second substrate stage WT2 and the calibration stage CS may be the same in the imprint apparatus and the lithography apparatus 100.

The imprint apparatus 27100 includes a platen 272, a substrate stage, an imprint head 277 and a resin supply unit 2713. A control system is provided to control the imprint apparatus. A substrate stage, supporting a substrate W, is arranged on the platen 272 to be movable within a horizontal plane (X-Y plane).

The resin supply unit 2713 is provided to supply the resin 2711 to at least a portion of the substrate W. The substrate W can be moved relative to the resin supply unit 2713, so a plurality of portions of the substrate W can be supplied with the resin 2711.

The imprint head 277 is arranged to hold a patterning device 276 and to move the patterning device 276 in a vertical direction (Z direction), thereby bringing the patterning device 276 and a resin 2711 on the substrate W into contact with each other (imprinting) or releasing (separating) the patterning device 276 from the resin 2711 on the substrate W. Alternatively or in addition, a substrate stage may be moved in the vertical direction to perform the imprinting or separating.

The embodiments described above may be implemented in the imprint apparatus. For example, the imprint apparatus may comprise the first substrate stage WT1, the second substrate stage WT2 and the calibration stage CS. The calibration stage CS may support a monitoring device to monitor a property of the imprint system 271. Such a property may be a contamination level of the patterning device 276, a contamination level of the imprint head 277 and/or a contamination level of the resin supply unit 2713. Such a property may be a property of the UV light 2710 such as dose or uniformity. In addition or alternatively, the calibration stage CS may comprise a cleaning device to clean at least one of the patterning device 276, the imprint head 277 and the resin supply unit 2713. An example of a cleaning device is described in Japanese patent application publication No. JP 2015-023210A, hereby incorporated by reference.

The control system of the imprint apparatus may be arranged to perform the pre-exposure scrum sweep operation 47 and to perform the substrate exchange operation 41. The control system may be arranged to start the pre-exposure sweep operation 47 after starting the substrate exchange operation 41.

The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

The terms "radiation beam B" and "exposure radiation" used herein encompass all types of electromagnetic radiation, including ultraviolet (UV) radiation (e.g. having a wavelength of or about 365, 248, 193, 157 or 126 nm). The term "lens", where the context allows, may refer to any one or combination of various types of optical components, including refractive and reflective optical components.

Other examples of electromagnetic radiation are visible light (e.g. having a wavelength between 400 nm and 700 nm) and EUV radiation (e.g. having a wavelength of or about 13.5 nm or 6.7 nm). UV radiation at a wavelength of 248 nm may be output by a KrF excimer laser apparatus. UV radiation at a wavelength of 193 nm may be output by a ArF excimer laser apparatus.

While specific embodiments of the invention have been described above, it will be appreciated that the invention may be practiced otherwise than as described. The descriptions above are intended to be illustrative, not limiting. Thus, it will be apparent to one skilled in the art that modifications may be made to the invention as described without departing from the scope of the claims set out below.

The invention claimed is:

1. An imprint apparatus, comprising:
a first substrate stage configured to hold a first substrate;
a second substrate stage configured to hold a second substrate;
an imprint system comprising:
a resin supply unit configured to provide a resin to at least a portion of the first substrate; and
an imprint head configured to hold a patterning device configured to form a pattern in the resin on the first substrate, wherein the imprint system is configured to provide UV light to cure the resin;
a calibration stage (CS), wherein the CS has a footprint that is smaller in proportion to a footprint of either of the first and second substrates, and wherein the CS comprises:
a monitoring device configured to monitor a property of the imprint system, the property comprising a uniformity of the UV light; and
a cleaning device configured to clean the imprint system based on a contamination level; and
a base board (BB), wherein each of the CS, the first substrate stage, and the second substrate stage is independently movable on the BB.

2. The imprint apparatus of claim 1, wherein the cleaning device is further configured to clean at least one of the imprint head, the patterning device, or the resin supply unit.

3. The imprint apparatus of claim 1, wherein the contamination level of the imprint system is determined by at least one of a contamination level of the imprint head, a contamination level of resin supply unit and a contamination level of the patterning device.

4. The imprint apparatus of claim 1, comprising a vertical movement pin configured to move at least one of the first substrate from a supporting surface of the first substrate stage to above the supporting surface and the second substrate from a supporting surface of the second substrate stage to above the supporting surface.

5. The imprint apparatus of claim 1, wherein:
the CS, the first substrate stage, and the second substrate stage are movable in a common plane.

6. The imprint apparatus of claim 1, wherein the calibration stage is further configured to not hold a substrate.

7. The imprint apparatus of claim 1, further comprising a measurement arm, wherein the first substrate stage comprises an opening shaped to receive the measurement arm when the first substrate stage is moved.

8. The imprint apparatus of claim 1, wherein the imprint head is configured to move the patterning device to bring the patterning device into contact with the resin.

9. The imprint apparatus of claim 8, wherein the imprint head is configured to move the patterning device in a vertical direction.

10. The imprint apparatus of claim 1, comprising:
a substrate unloader configured to unload at least one of the first substrate from the first substrate stage and the second substrate from the second substrate stage during a substrate exchange operation; and
a control system configured to control positioning of at least one of the first substrate stage, the second substrate stage, the calibration stage (CS) and the substrate unloader.

11. The imprint apparatus of claim 10,
wherein the control system is configured to start a pre-exposure scrum sweep operation after the substrate exchange operation, wherein during the pre-exposure scrum sweep operation, the calibration stage moves away from alignment with the patterning device while the second substrate stage moves into alignment with the patterning device, and
wherein the first substrate stage and the second substrate stage are configured to hold respectively the first substrate and the second substrate before the substrate exchange operation.

12. The imprint apparatus of claim 10, wherein the control system is configured to control the calibration stage (CS) to be aligned with the patterning device when the substrate exchange operation begins.

13. The imprint apparatus of claim 10, wherein the imprint apparatus is configured to perform a cleaning operation by the cleaning device at the same time as the substrate exchange operation.

14. The imprint apparatus of claim 10, wherein the control system is further configured to:
schedule an offline cleaning operation to the imprint system in response to determining that the contamination level is equal to or above an offline cleaning threshold level, wherein the offline cleaning operation is a liquid-based cleaning operation performed by a liquid cleaner.

15. The imprint apparatus of claim 10, wherein the control system is further configured to:
schedule an online cleaning operation to the imprint system in response to determining that the contamination level is below the offline cleaning threshold level, wherein the online cleaning operation is an ultrasonic cleaning operation performed by the cleaning device.

16. The imprint apparatus of claim 10, wherein the imprint apparatus is configured to overlap a time of a cleaning operation by the cleaning device and a time of the substrate exchange operation.

17. The imprint apparatus of claim 1, comprising an alignment system configured to measure positions of multiple alignment marks on at least one of the first substrate and the second substrate.

18. The imprint apparatus of claim 17, wherein the alignment system comprises multiple alignment sensors.

19. The imprint apparatus of claim 1, wherein the cleaning device includes a vibration member.

20. The imprint apparatus of claim 19, wherein the cleaning device further includes a ultrasonic wave generator configured to vibrate the vibration member.

* * * * *